(12) United States Patent
Shen

(10) Patent No.: US 11,961,887 B2
(45) Date of Patent: *Apr. 16, 2024

(54) SEMICONDUCTOR DEVICE HAVING NANOSHEET TRANSISTOR AND METHODS OF FABRICATION THEREOF

(71) Applicant: TAIWAN SEMICONDUCTOR MANUFACTURING COMPANY, LTD., Hsinchu (TW)

(72) Inventor: Shu-Wen Shen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/993,598

(22) Filed: Nov. 23, 2022

(65) Prior Publication Data

US 2023/0095479 A1    Mar. 30, 2023

Related U.S. Application Data

(63) Continuation of application No. 17/367,559, filed on Jul. 5, 2021, now Pat. No. 11,515,393.

(Continued)

(51) Int. Cl.
| | |
|---|---|
| H01L 29/06 | (2006.01) |
| H01L 21/8234 | (2006.01) |
| H01L 29/417 | (2006.01) |
| H01L 29/423 | (2006.01) |
| H01L 29/66 | (2006.01) |

(Continued)

(52) U.S. Cl.
CPC .. *H01L 29/0673* (2013.01); *H01L 21/823418* (2013.01); *H01L 21/823431* (2013.01); *H01L 29/41791* (2013.01); *H01L 29/42392* (2013.01); *H01L 29/66742* (2013.01); *H01L 29/66795* (2013.01); *H01L 29/7851* (2013.01); *H01L 29/78696* (2013.01)

(58) Field of Classification Search
CPC ......... H01L 29/42392; H01L 29/78696; H01L 29/0653; H01L 21/823418; H01L 29/0673; H01L 29/41791; H01L 29/6656; H01L 29/6653; H01L 21/823481; H01L 21/823437; H01L 29/66545; H01L 21/823431; H01L 29/66742; H01L 29/66795; H01L 29/7851
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |

(Continued)

*Primary Examiner* — Changhyun Yi
(74) *Attorney, Agent, or Firm* — NZ CARR LAW OFFICE

(57) ABSTRACT

A semiconductor device structure is provided. The device includes a plurality of semiconductor layers and a gate electrode layer surrounding each semiconductor layer of the plurality of semiconductor layers. The gate electrode layer includes a first part, and a second part below the first part, the second part comprises a first portion, wherein an exterior surface of the first portion has a first radius of curvature, and a second portion below the first portion, and a third portion below the second portion, wherein an exterior surface of the third portion having a second radius of curvature different than the first radius of curvature.

20 Claims, 32 Drawing Sheets

Related U.S. Application Data

(60) Provisional application No. 63/168,895, filed on Mar. 31, 2021.

(51) Int. Cl.
*H01L 29/78* (2006.01)
*H01L 29/786* (2006.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,515,393 B2 * | 11/2022 | Shen ................. H01L 29/66795 |
| 2020/0395445 A1 | 12/2020 | Choi et al. |
| 2021/0050415 A1 * | 2/2021 | Bhuwalka ............... B82Y 10/00 |
| 2021/0217860 A1 | 7/2021 | Ha et al. |

\* cited by examiner

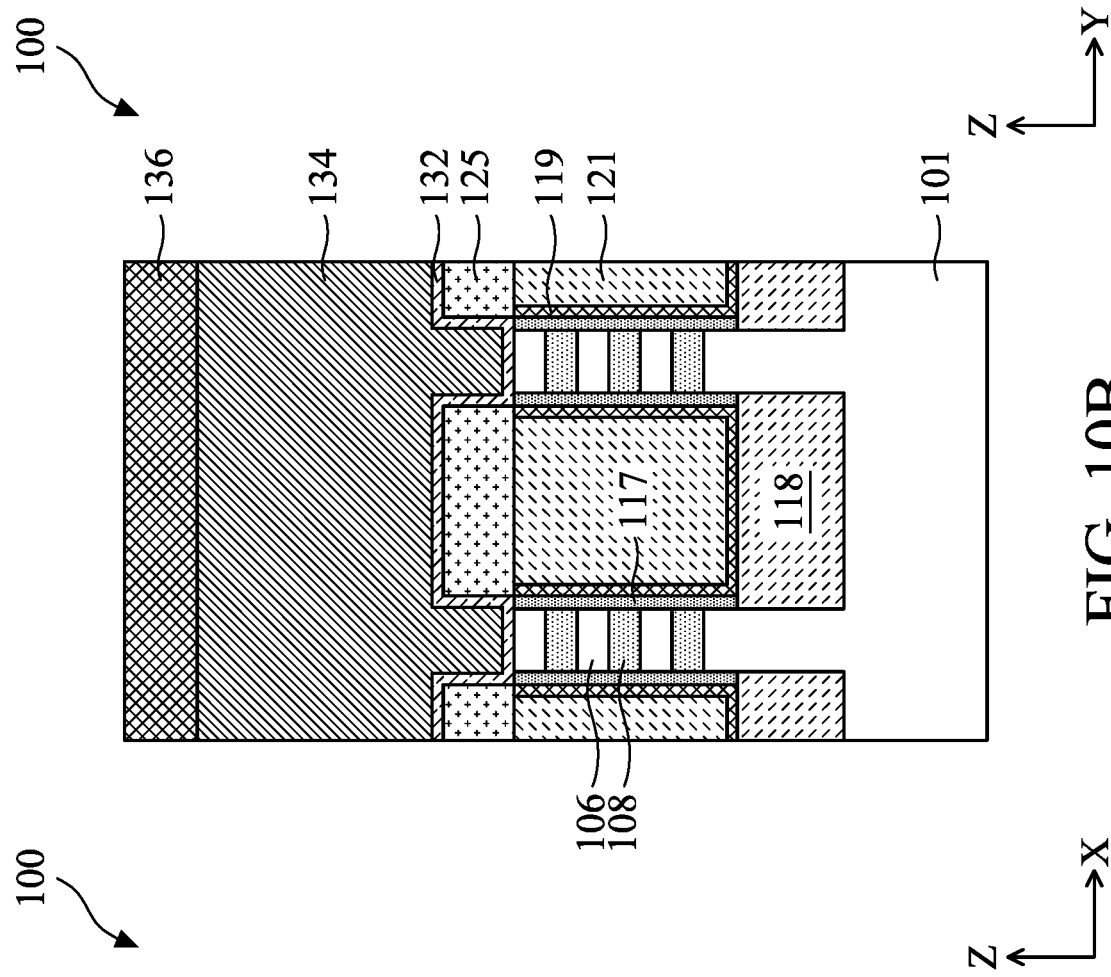
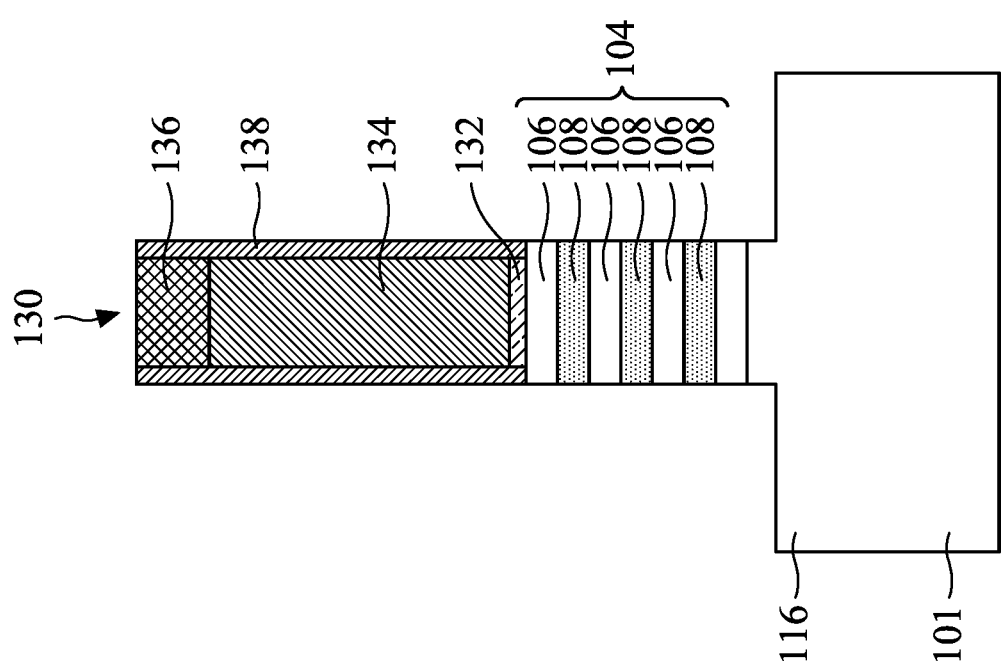
FIG. 10A
FIG. 10B

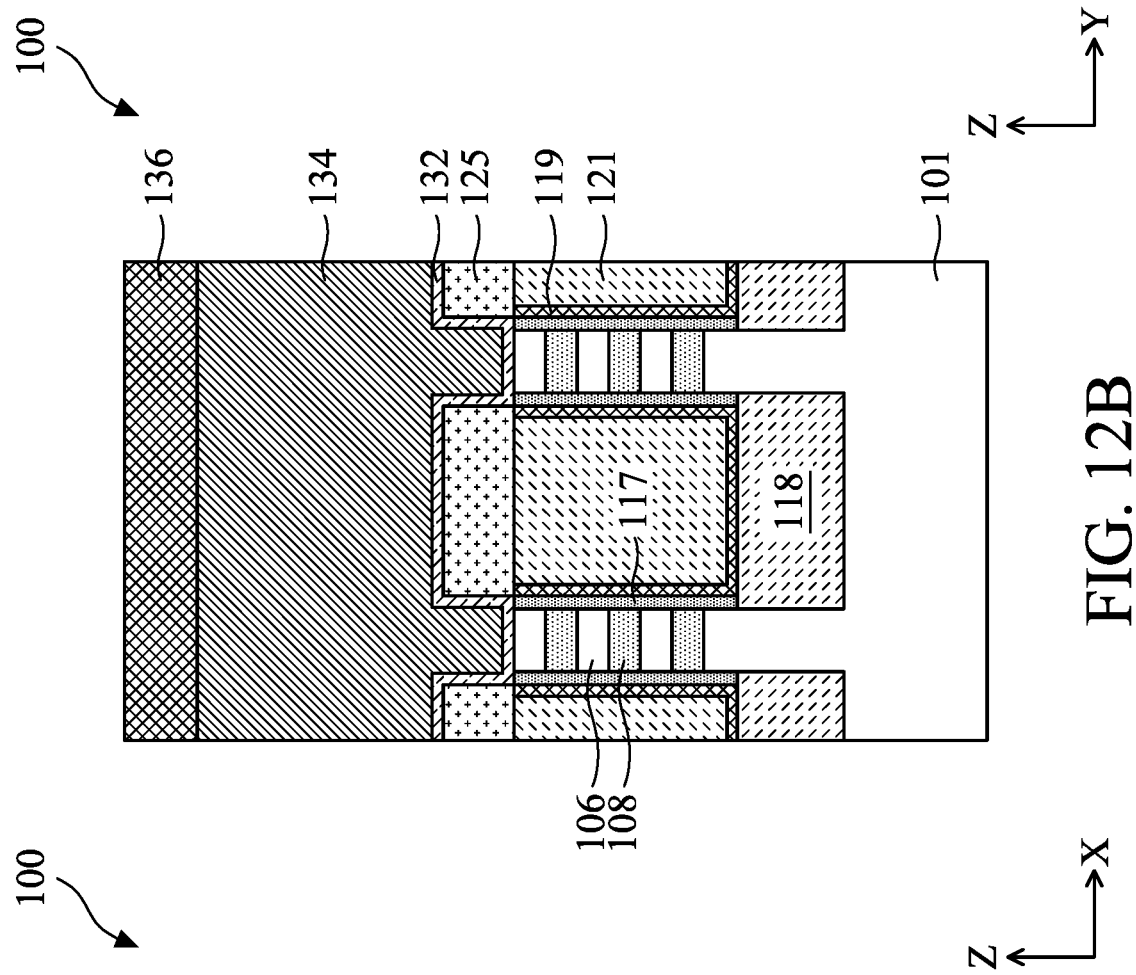
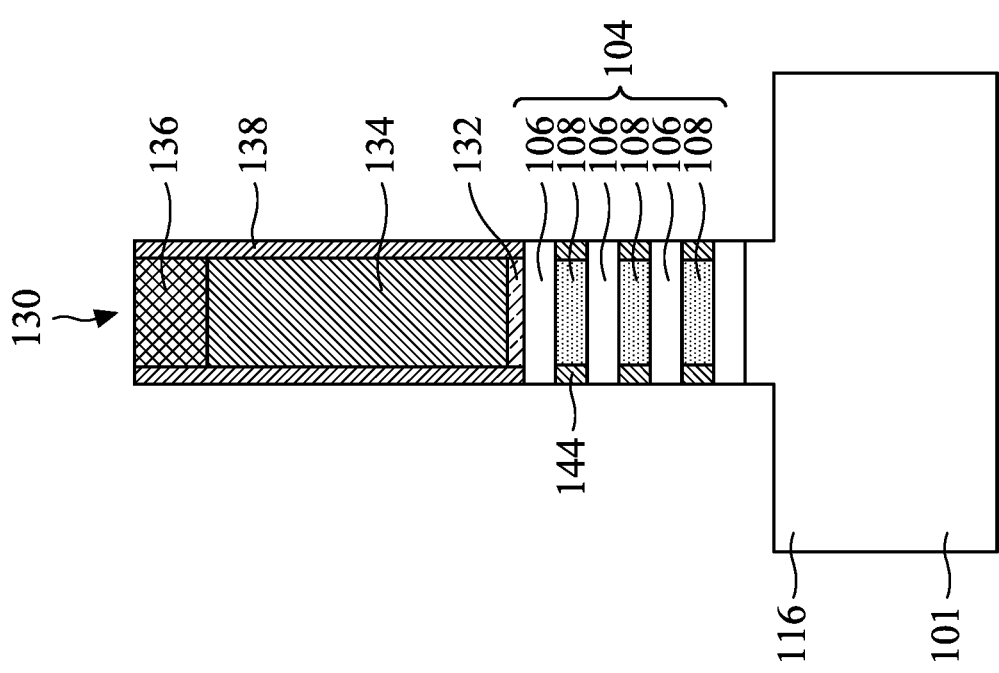
FIG. 12B
FIG. 12A

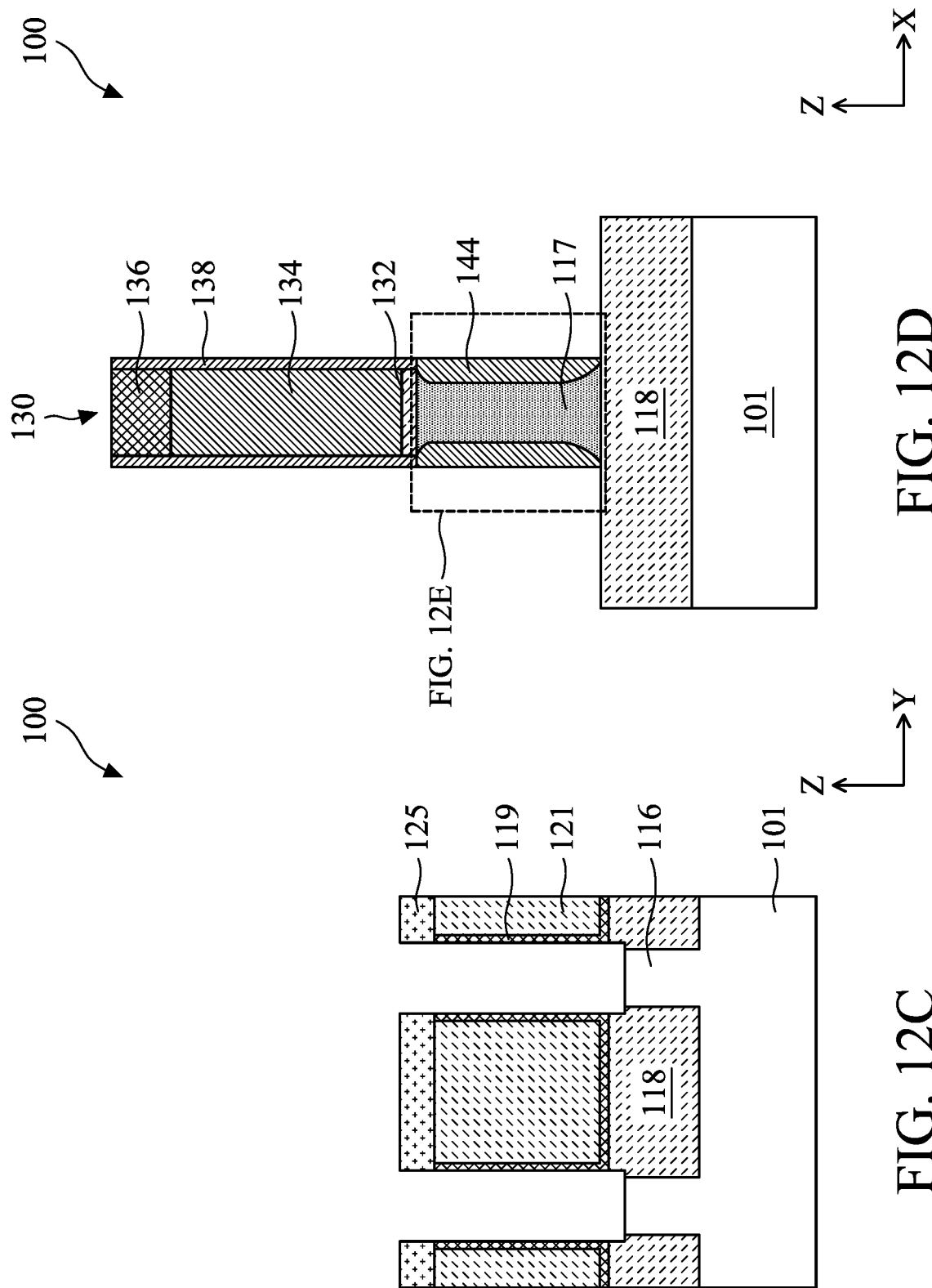

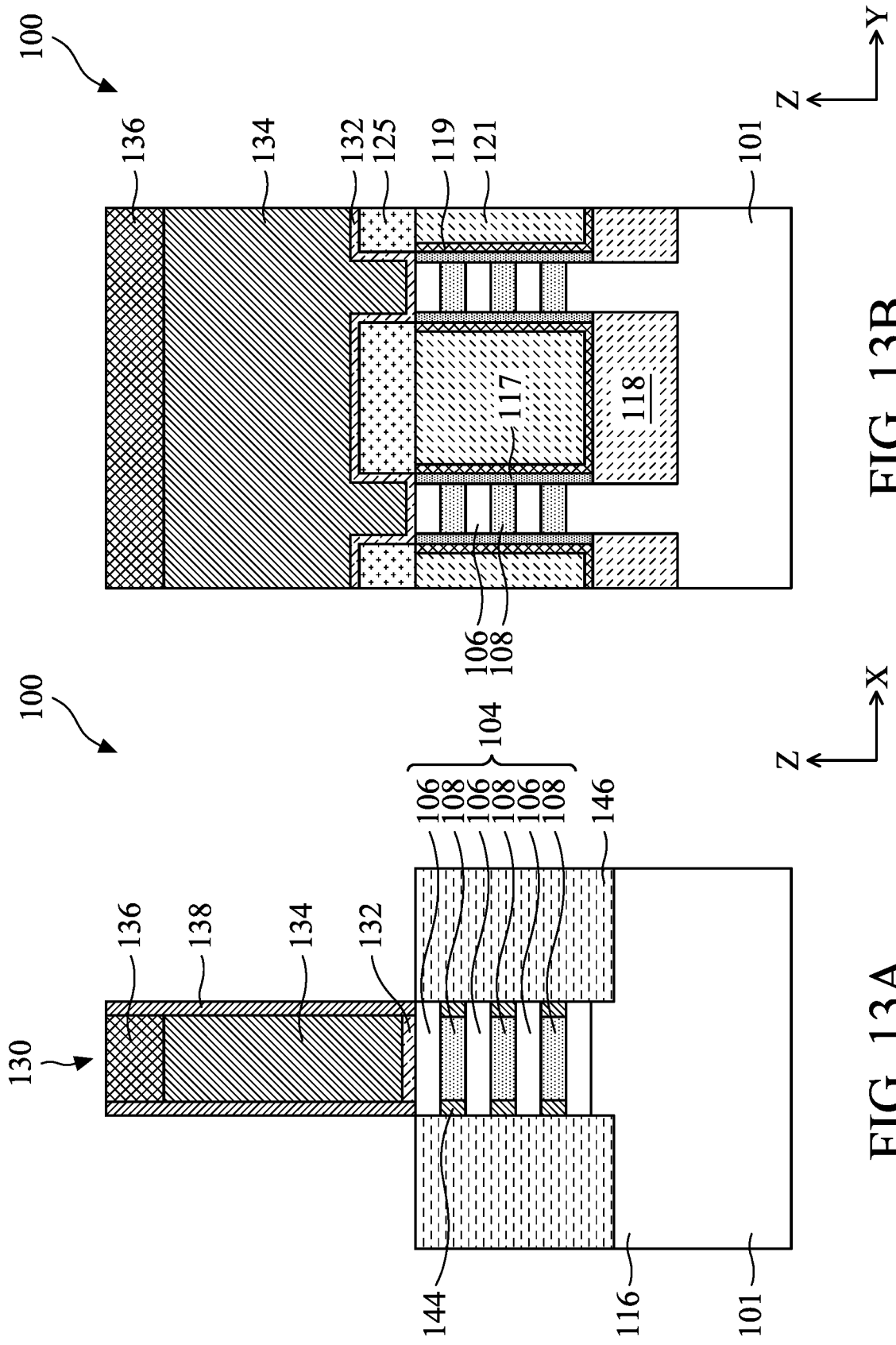

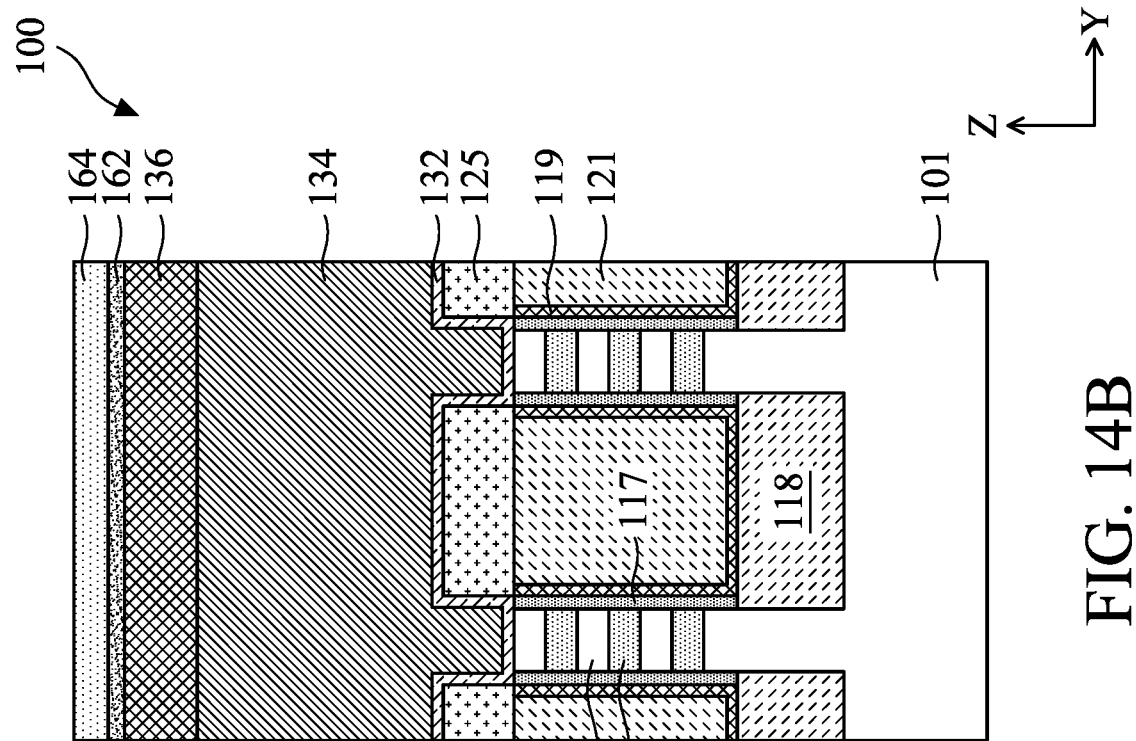
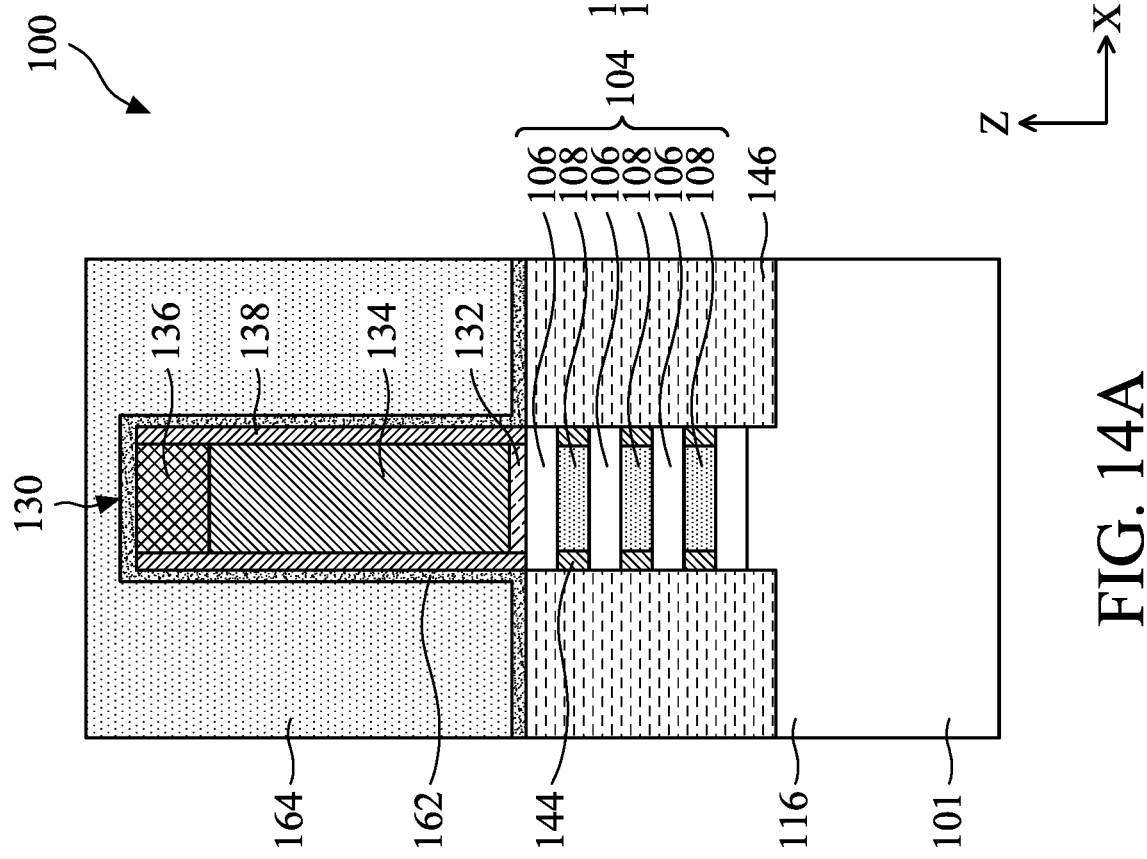
FIG. 14B
FIG. 14A

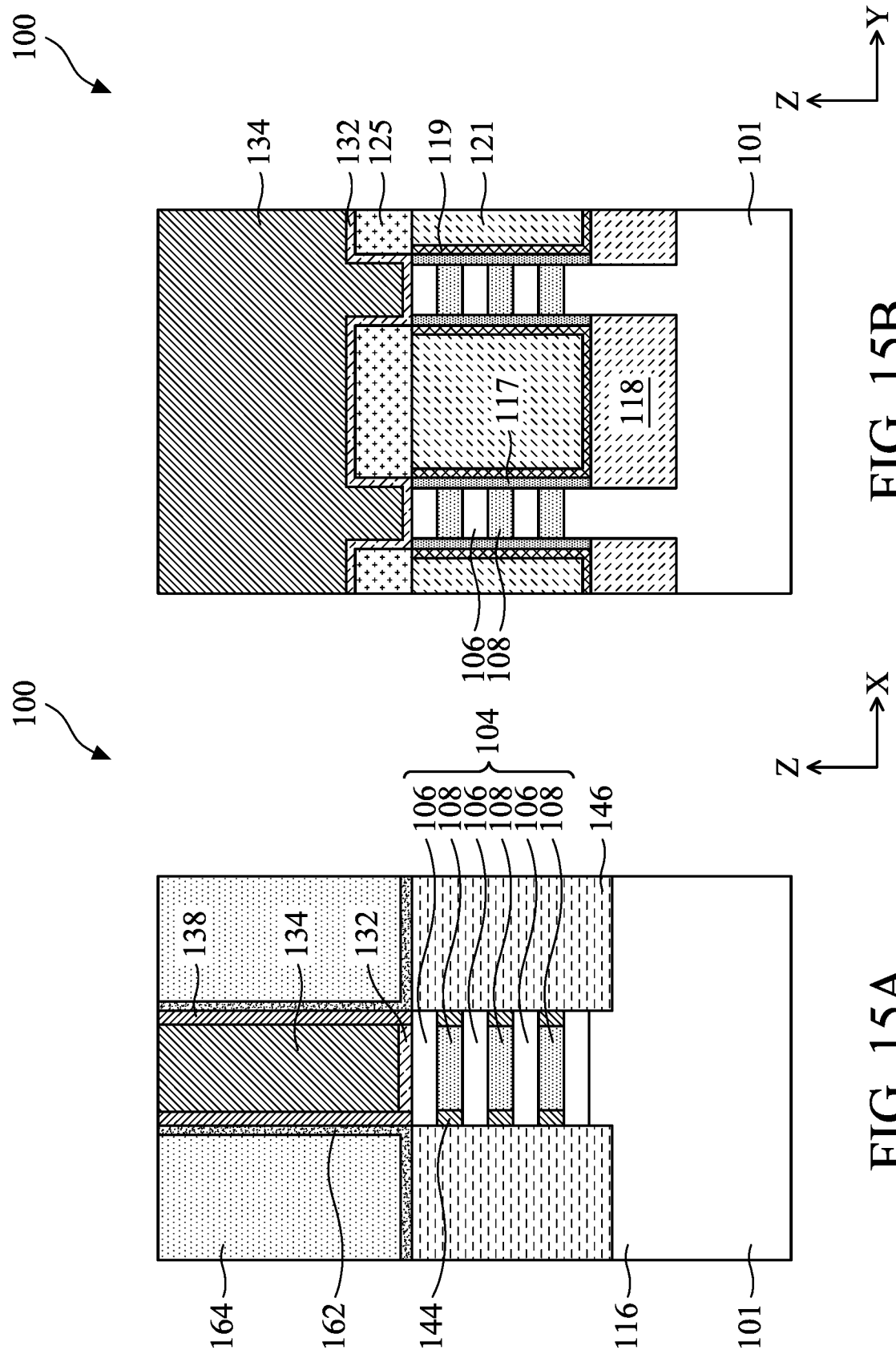

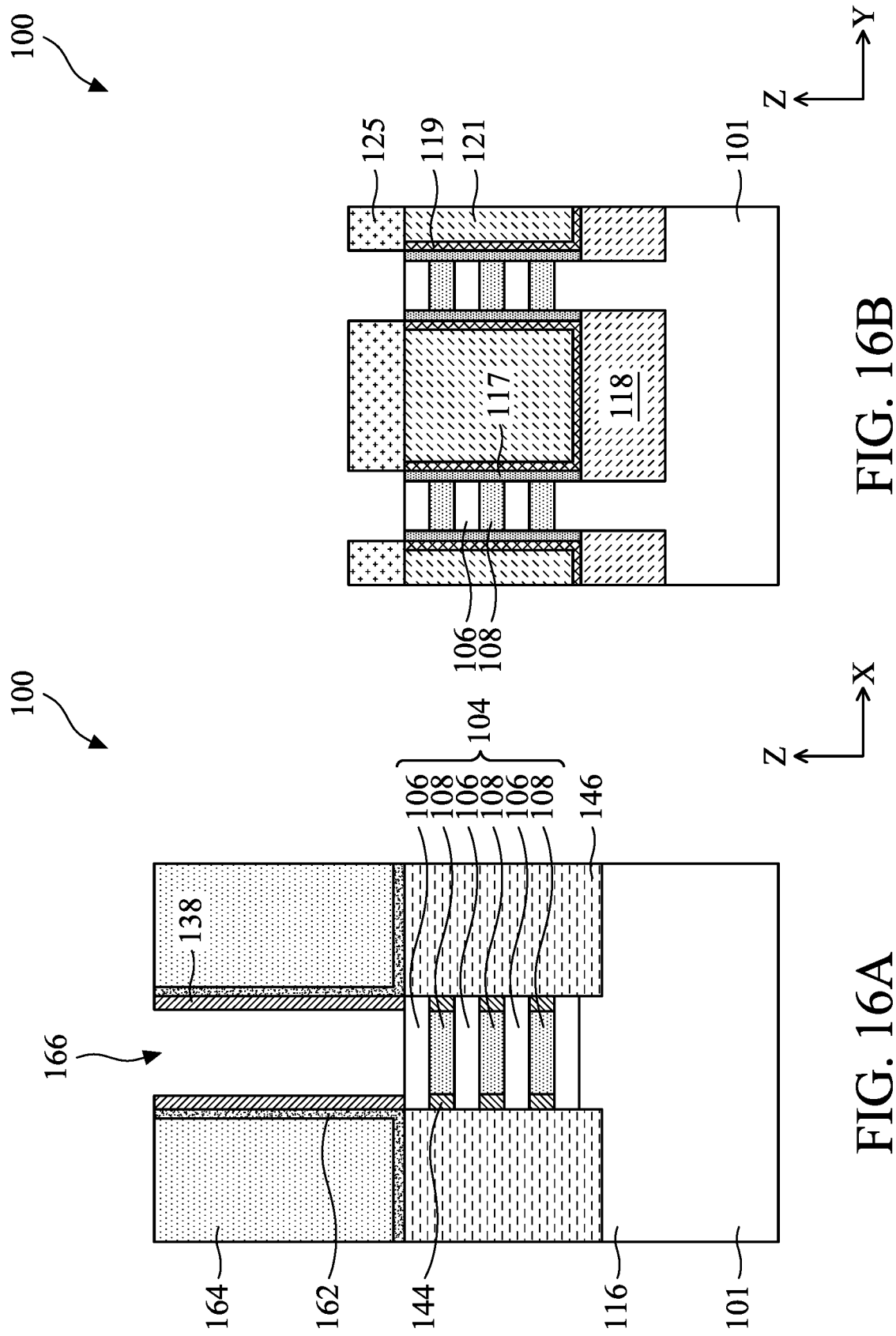

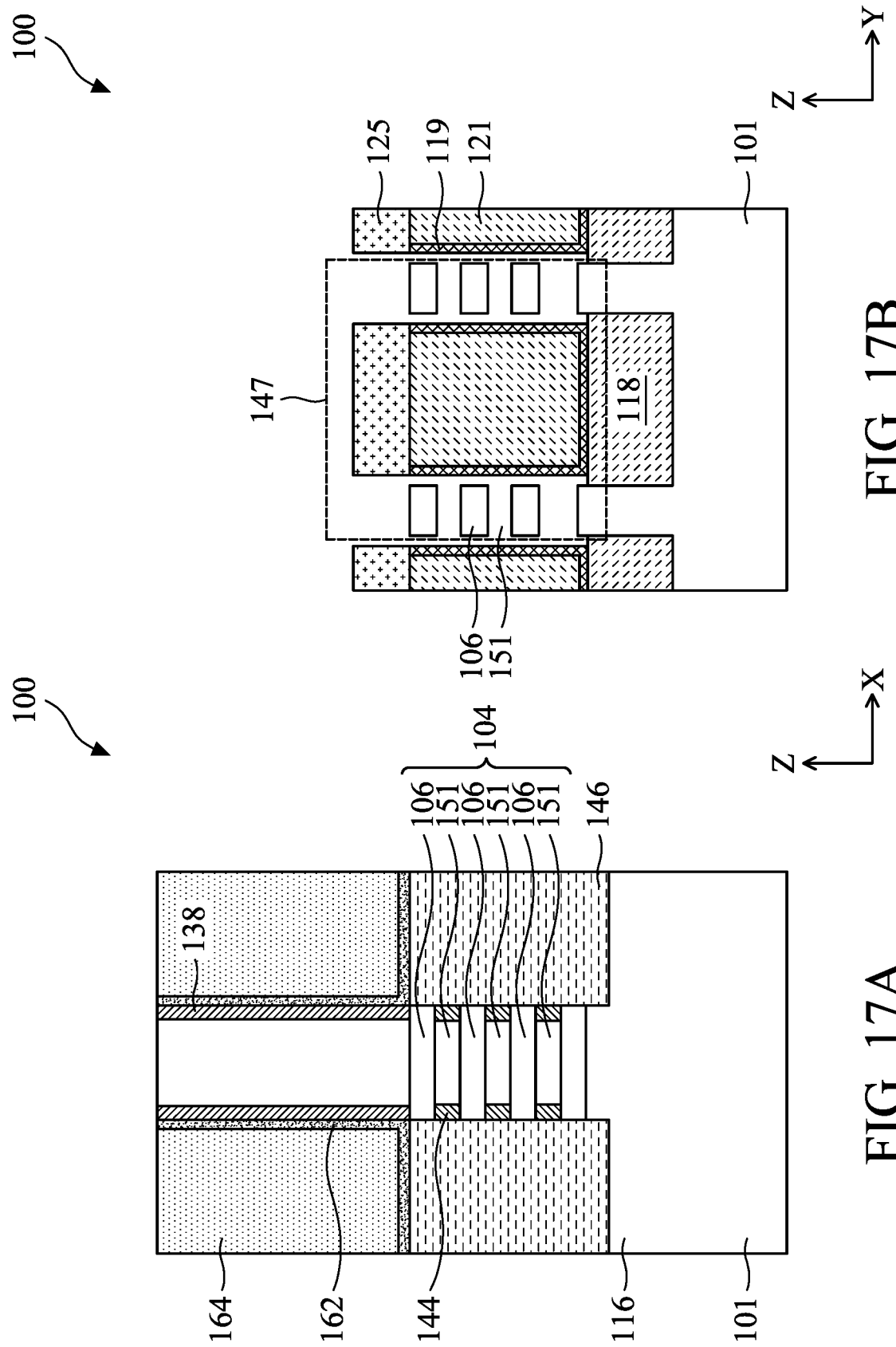

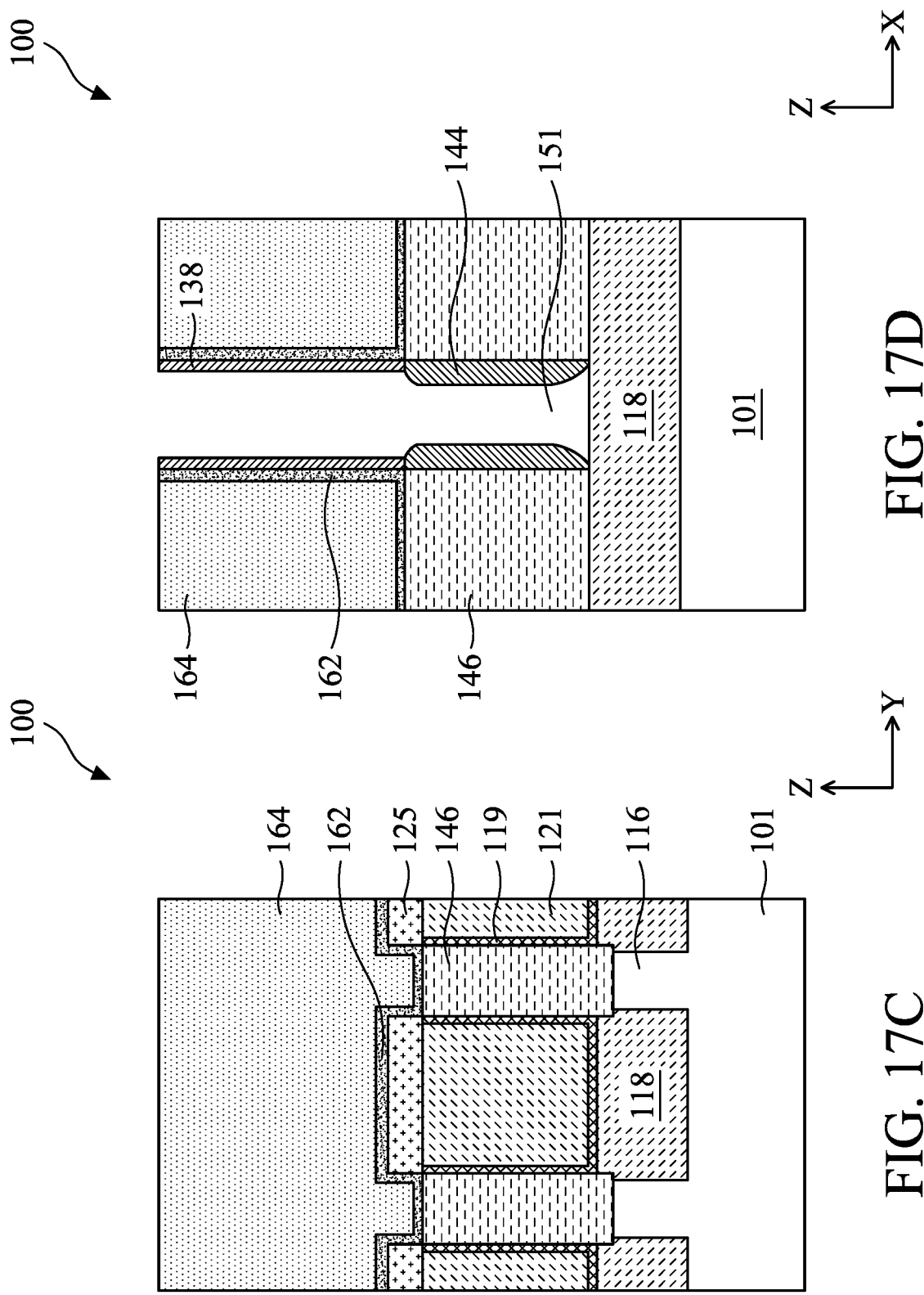

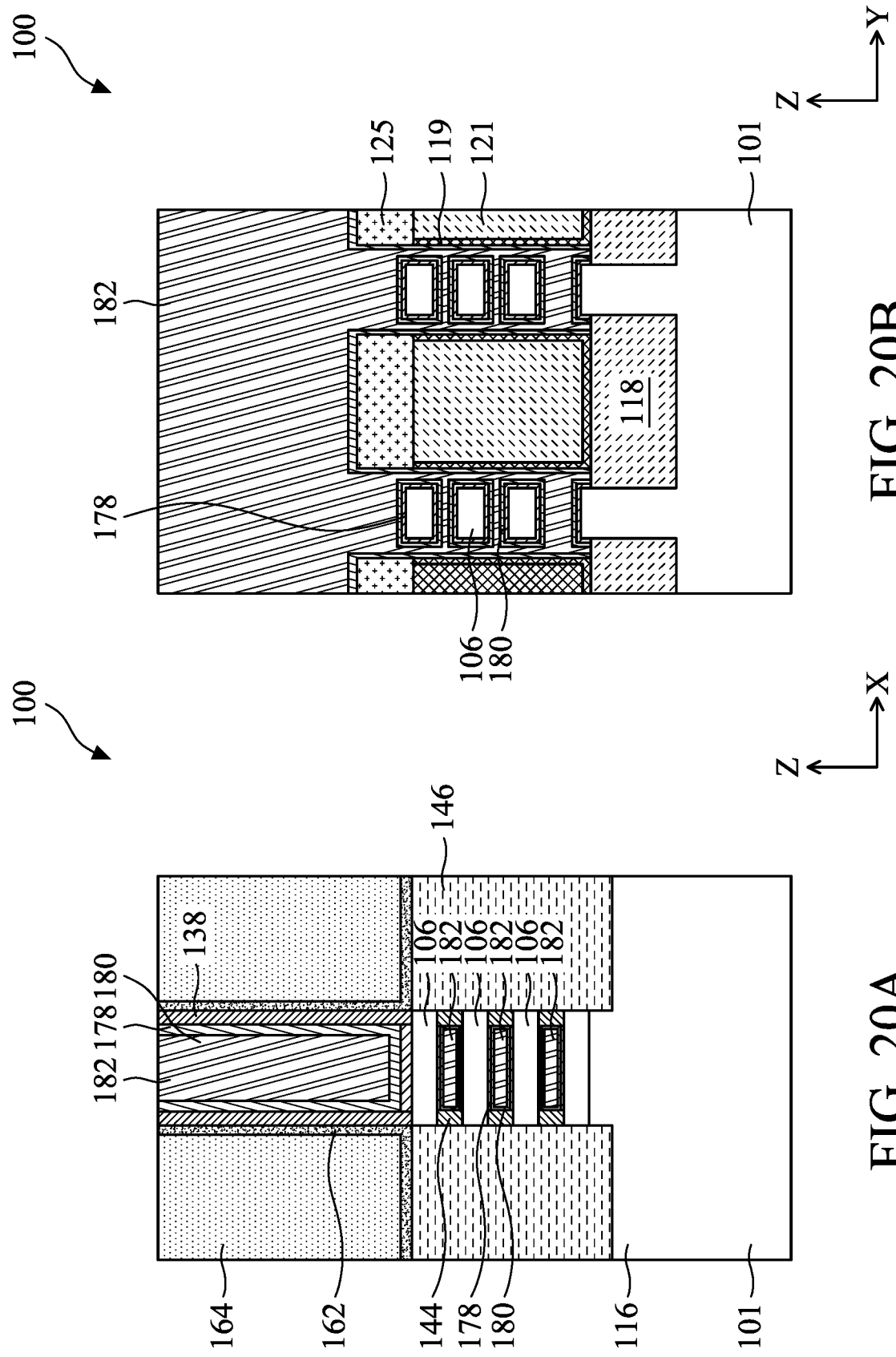

SEMICONDUCTOR DEVICE HAVING NANOSHEET TRANSISTOR AND METHODS OF FABRICATION THEREOF

CROSS-REFERENCE TO RELATED APPLICATIONS

This application is a continuation application of U.S. patent application Ser. No. 17/367,559 filed Jul. 5, 2021, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge.

In pursuit of higher device density, higher performance, and lower costs, challenges from both fabrication and design issues have resulted in the development of three-dimensional designs, such as a multi-gate field effect transistor (FET), including a nanosheet FET. In a nanosheet FET, all side surfaces of the channel region are surrounded by the gate electrode, which allows for fuller depletion in the channel and results in less short-channel effects and better gate control. As transistor dimensions are continually scaled down, further improvements of the nanosheet FET are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A-17A are cross-sectional views of one of the various stages of manufacturing the semiconductor device structure taken along cross-section A-A of FIG. 9, in accordance with some embodiments.

FIGS. 10B-17B are cross-sectional side views of the semiconductor device structure taken along cross-section B-B of FIG. 9, in accordance with some embodiments.

FIGS. 10C-17C are cross-sectional views of one of the various stages of manufacturing the semiconductor device structure taken along cross-section C-C of FIG. 9, in accordance with some embodiments.

FIGS. 10D-12D are cross-sectional views of one of the various stages of manufacturing the semiconductor device structure taken along cross-section D-D of FIG. 9, in accordance with some embodiments.

FIG. 17D is an enlarged view of a portion of the semiconductor device structure of FIG. 17A, in accordance with some embodiments.

FIGS. 20A-20C to 21A-21C are cross-sectional views of one of the various stages of the semiconductor device structure taken along cross-sections A-A, B-B, and C-C of FIG. 9, in accordance with some embodiments.

DETAILED DESCRIPTION

Figure 1:
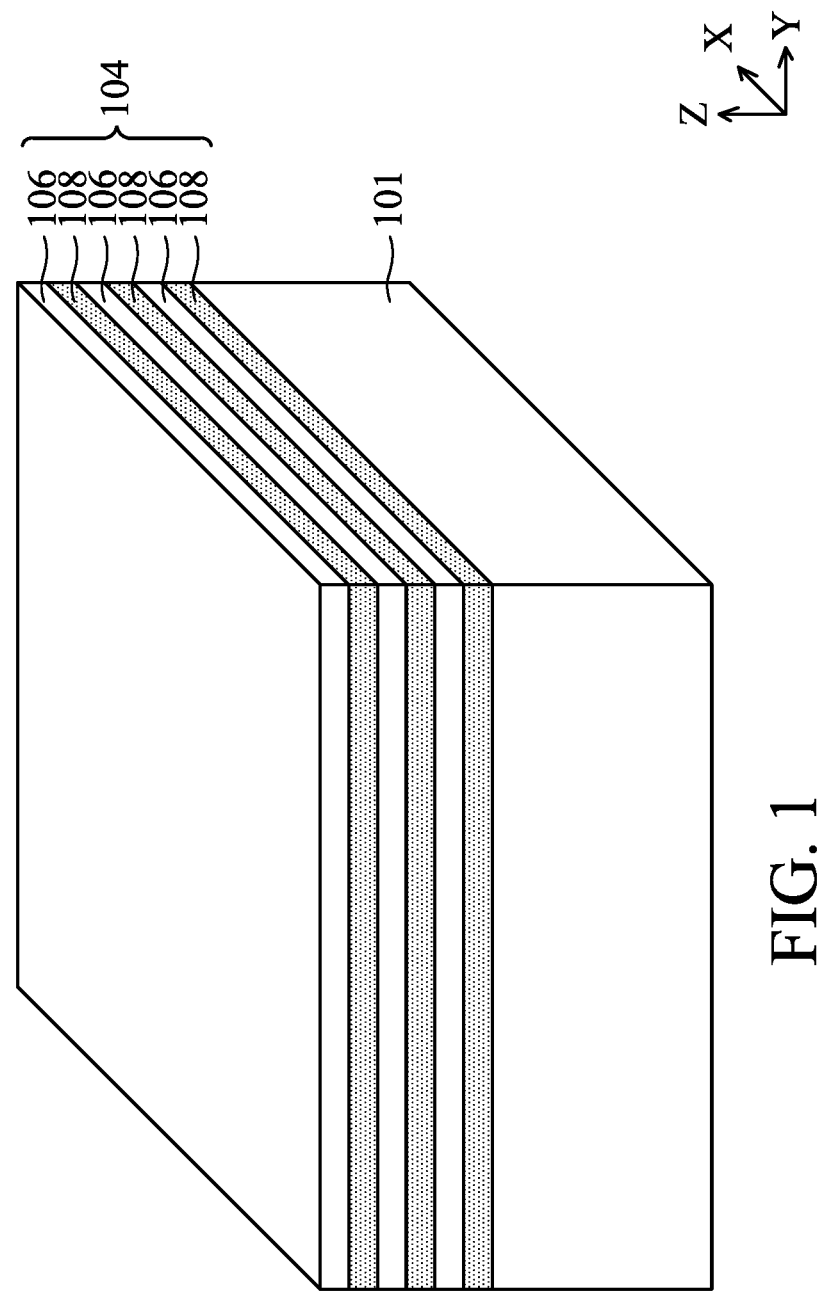
FIGS. 1-9 are perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed."

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-21C show exemplary processes for manufacturing a semiconductor device structure 100 according to embodiments of the present disclosure. It is understood that additional operations can be provided before, during, and after processes shown by FIGS. 1-21C, and some of the operations described below can be replaced or eliminated, for additional embodiments of the method. The order of the operations/processes is not limiting and may be interchangeable.

FIGS. 1-9 are perspective views of various stages of manufacturing a semiconductor device structure 100 in accordance with some embodiments. As shown in FIG. 1, a semiconductor device structure 100 includes a stack of semiconductor layers 104 formed over a substrate 101. The substrate 101 may be a semiconductor substrate. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In one embodiment, the substrate 101 is made of silicon. In some embodiments, the substrate 101 is a silicon-on-insulator (all) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type conductivity). Depending on circuit design, the dopants may be, for example boron for p-type field effect transistors (p-type FETs) and phosphorus for n-type field effect transistors (n-type FETs).

The stack of semiconductor layers 104 includes semiconductor layers made of different materials to facilitate formation of nanosheet channels in a multi-gate device, such as nanosheet channel FETs. In some embodiments, the stack of semiconductor layers 104 includes first semiconductor layers 106 and second semiconductor layers 108. In some embodiments, the stack of semiconductor layers 104 includes first and second semiconductor layers 106, 108 that are alternatingly arranged. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The thickness of the first semiconductor layer 106 and the second semiconductor layer 108 may vary depending on the application and/or device performance considerations. In some embodiments, each first and second semiconductor layer 106, 108 has a thickness in a range between about 5 nm and about 30 nm. In other embodiments, each first and second semiconductor layer 106, 108 has a thickness in a range between about 10 nm and about 20 nm. In some embodiments, each first and second semiconductor layer 106, 108 has a thickness in a range between about 6 nm and about 12 nm. Each second semiconductor layer 108 may have a thickness that is equal, less, or greater than the thickness of the first semiconductor layer 106. The second semiconductor layers 108 may eventually be removed and serve to define a vertical distance between adjacent channels for the semiconductor device structure 100.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes. While three first semiconductor layers 106 and three second semiconductor layers 108 are alternately arranged as illustrated in FIG. 1, it can be appreciated that any number of first and second semiconductor layers 106, 108 can be formed in the stack of semiconductor layers 104, depending on the predetermined number of nanosheet channels needed for each FET of the semiconductor device structure 100. For example, the number of first semiconductor layers 106, which is the number of channels, may be between 2 and 8.

Figure 2:
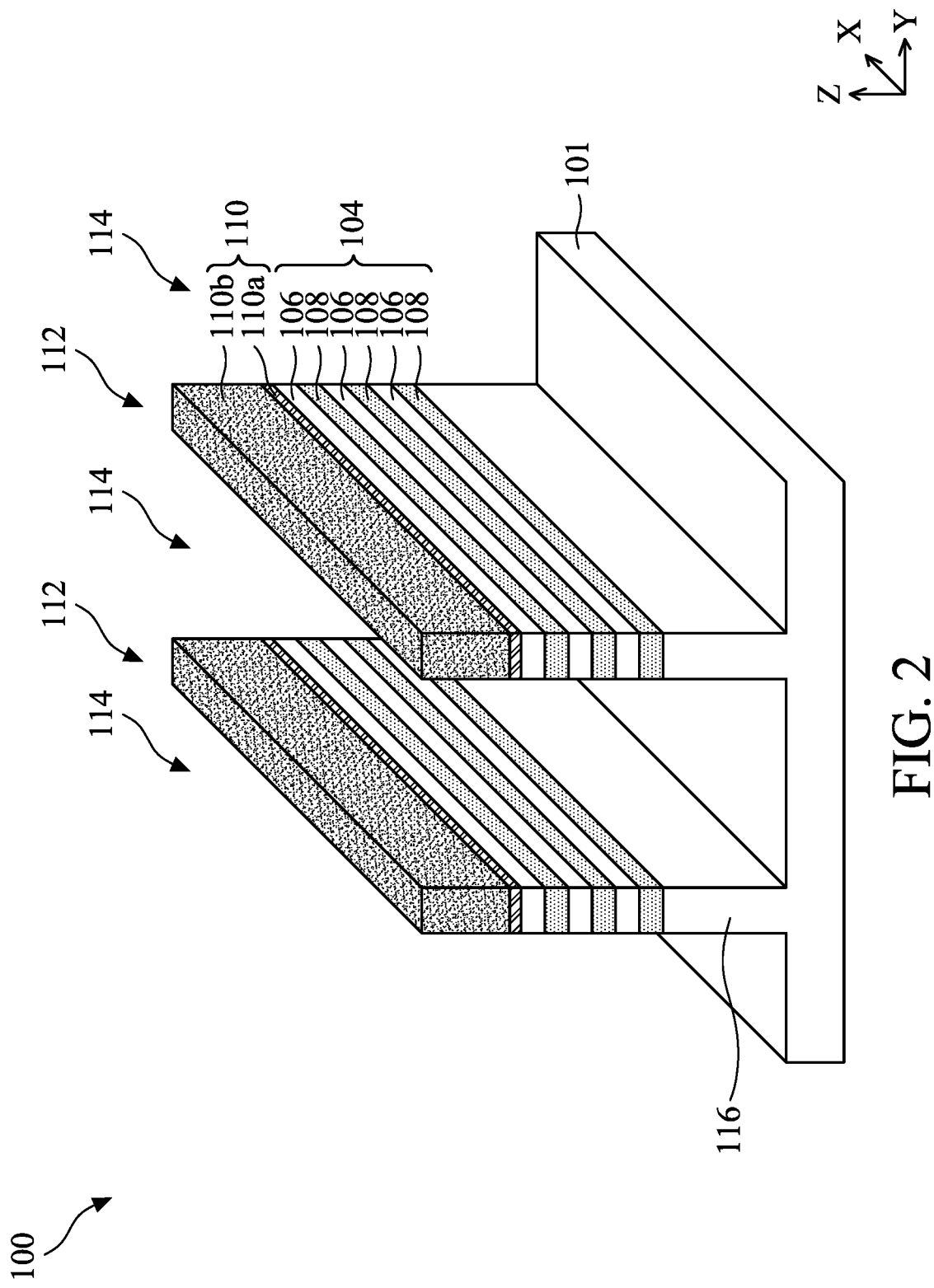

In FIG. 2, fin structures 112 are formed from the stack of semiconductor layers 104. Each fin structure 112 has an upper portion including the semiconductor layers 106, 108, a well portion 116 formed from the substrate 101, and a portion of a mask structure 110. The mask structure 110 is formed over the stack of semiconductor layers 104 prior to forming the fin structures 112. The mask structure 110 may include a pad layer 110a and a hard mask 110b. The pad layer 110a may be an oxygen-containing layer, such as a $SiO_2$ layer, or a nitrogen-containing layer, such as $Si_3N_4$. The mask structure 110 may be formed by any suitable deposition process, such as chemical vapor deposition (CVD) process.

The fin structures 112 may be fabricated using suitable processes including photolithography and etch processes. In some embodiments, the photolithography process may include forming a photoresist layer (not shown) over the mask structure 110, exposing the resist to a pattern, performing post-exposure bake processes, and developing the resist to form a patterned resist. The patterned resist may then be used to protect regions of the substrate 101, and layers formed thereupon, while an etch process forms trenches 114 in unprotected regions through the mask structure 110, the stack of semiconductor layers 104, and into the substrate 101, thereby leaving the extending fin structures 112. The trenches 114 may be etched using a dry etch (e.g., RIE), a wet etch, and/or combination thereof. While two fin structures 112 are shown, the number of the fin structures is not limited to two.

Figure 3:
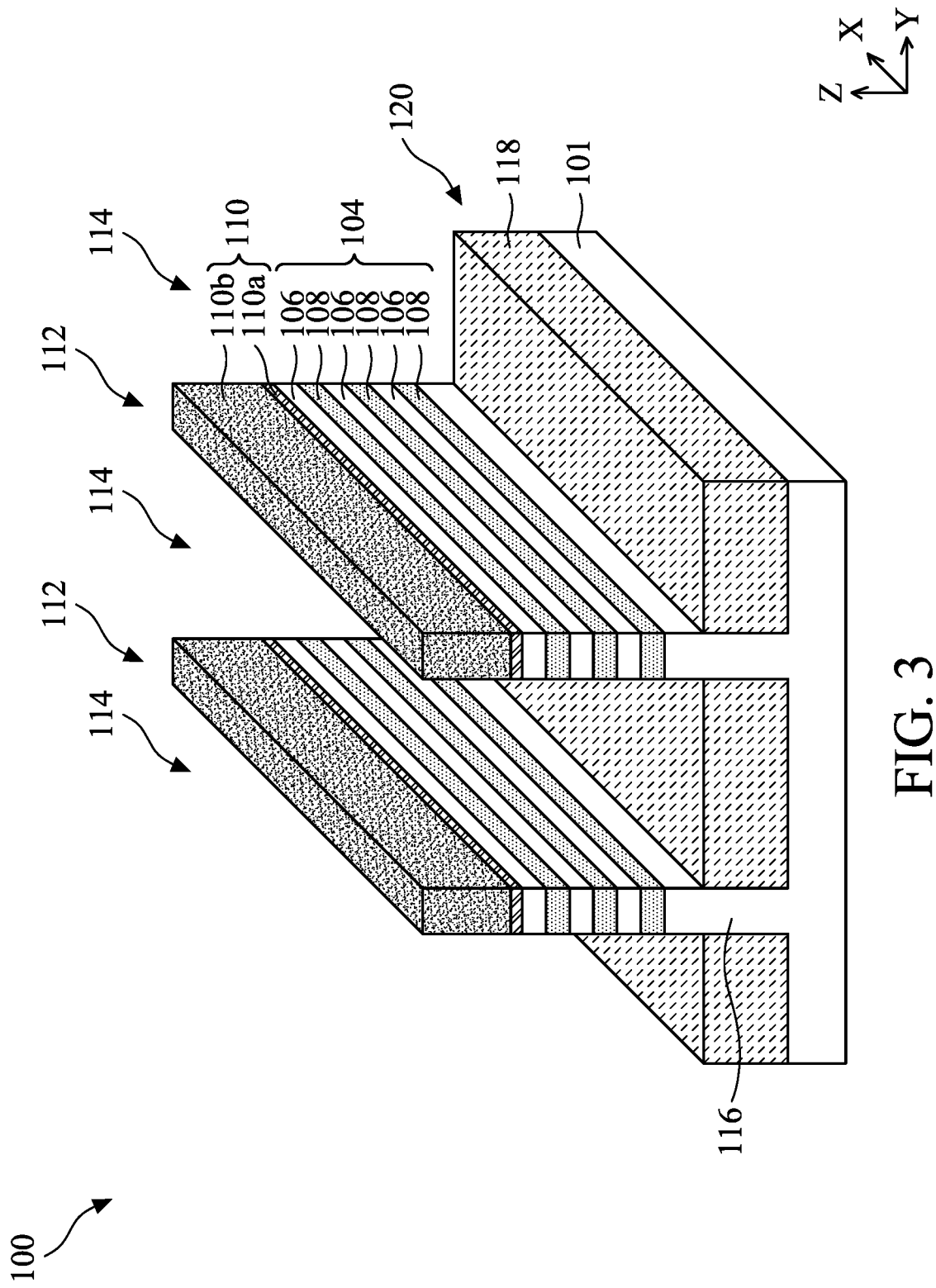

In FIG. 3, after the fin structures 112 are formed, an insulating material 118 is formed in the trenches 114 between the fin structures 112. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed to expose the top of the fin structures 112. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Next, the insulating material 118 is recessed to form an isolation region 120. The recess of the insulating material 118 exposes portions of the fin structures 112. The isolation region 120 may be formed using a suitable process, such as a dry etching process, a wet etching process, or a combination thereof. A top surface of the insulating material 118 may be level with or below a surface of the second semiconductor layers 108 in contact with the well portion 116.

In some embodiments, a pre-clean process may be performed to remove residues from exposed surfaces of the fin structures 112. The pre-clean process may be any suitable wet cleaning process including, for example, hydrofluoric acid (HF), standard clean 1 (SC1), and ozonated deionized water ($DIO_3$). In one embodiment, the pre-clean process is performed by exposing the semiconductor device structure 100 to HF (1:500 dilution) for about 25 seconds to about 60 seconds, such as about 40 seconds, followed by the $DIO_3$ rinsing for about 20 seconds to about 50 seconds, such as about 30 seconds, and SC1 cleaning, which is a mixture of deionized (DI) water, ammonia hydroxide ($NH_4OH$), and hydrogen peroxide ($H_2O_2$), for about 35 seconds to about 70 seconds, such as about 50 seconds. Other pre-clean process, such as an APM process, which includes at least water ($H_2O$), $NH_4OH$, and $H_2O_2$, a HPM process, which includes at least $H_2O$, $H_2O_2$, and hydrogen chloride (HCl), a SPM process (also known as piranha clean), which includes at least $H_2O_2$ and sulfuric acid ($H_2SO_4$), or any combination thereof, may also be used.

Figure 4:
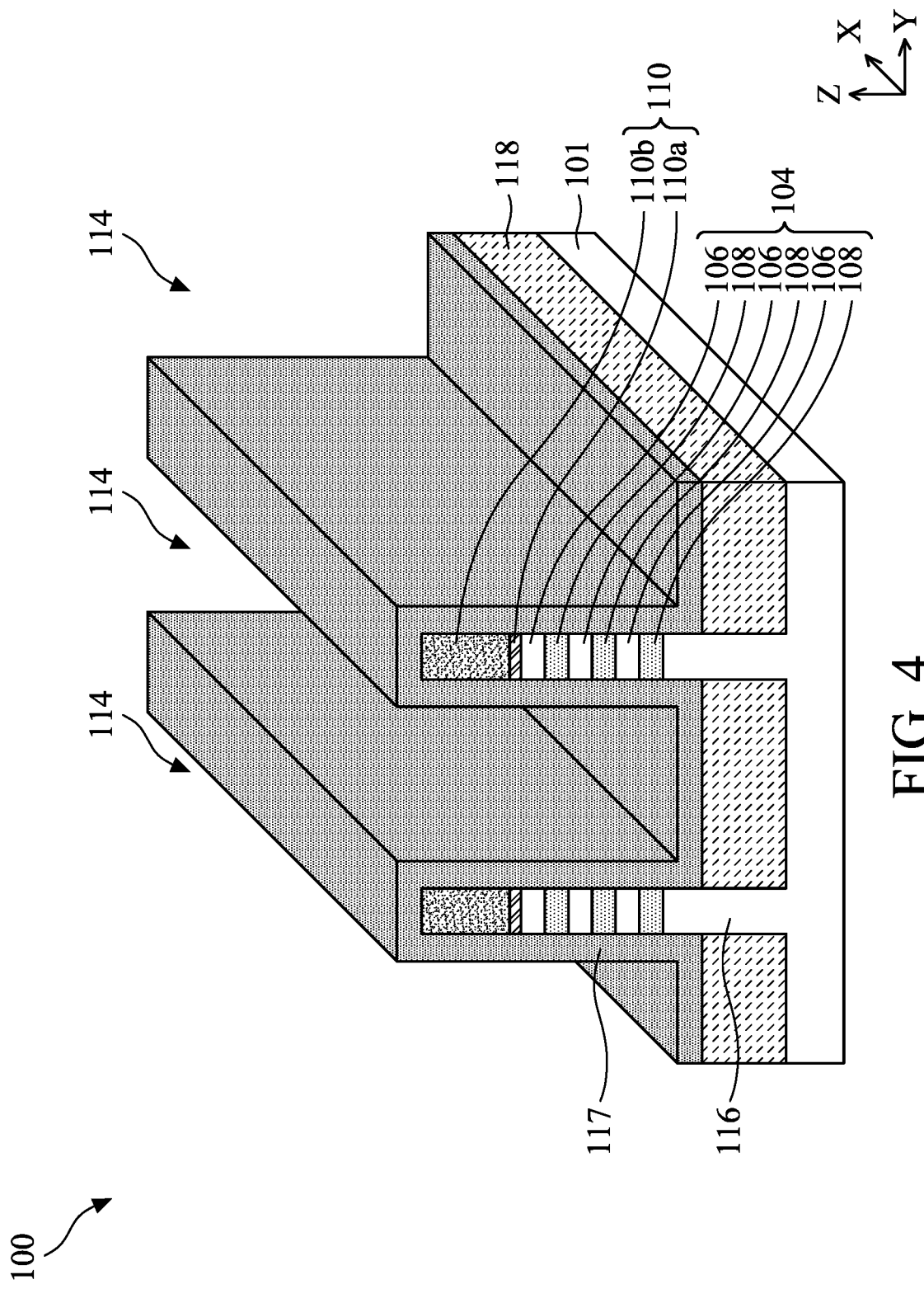

In FIG. 4, a cladding (or sacrificial) layer 117 is formed by an epitaxial process over exposed portion of the fin structures 112. In some embodiments, a semiconductor liner (not shown) may be first formed over the fin structures 112, and the cladding layer 117 is then formed over the semiconductor liner. The semiconductor liner may be diffused into the cladding layer 117 during the formation of the cladding layer 117. In either case, the cladding layer 117 is in contact with the stack of semiconductor layers 104. In some embodiments, the cladding layer 117 and the second semiconductor layers 108 include the same material having the same etch selectivity. For example, the cladding layer 117 and the second semiconductor layers 108 may be or include SiGe. In one embodiment, the cladding layer 117 is SiGe in amorphous state (a-SiGe). The cladding layer 117 and the second semiconductor layers 108 may be removed subsequently to create space for the gate electrode layer.

Figure 5:
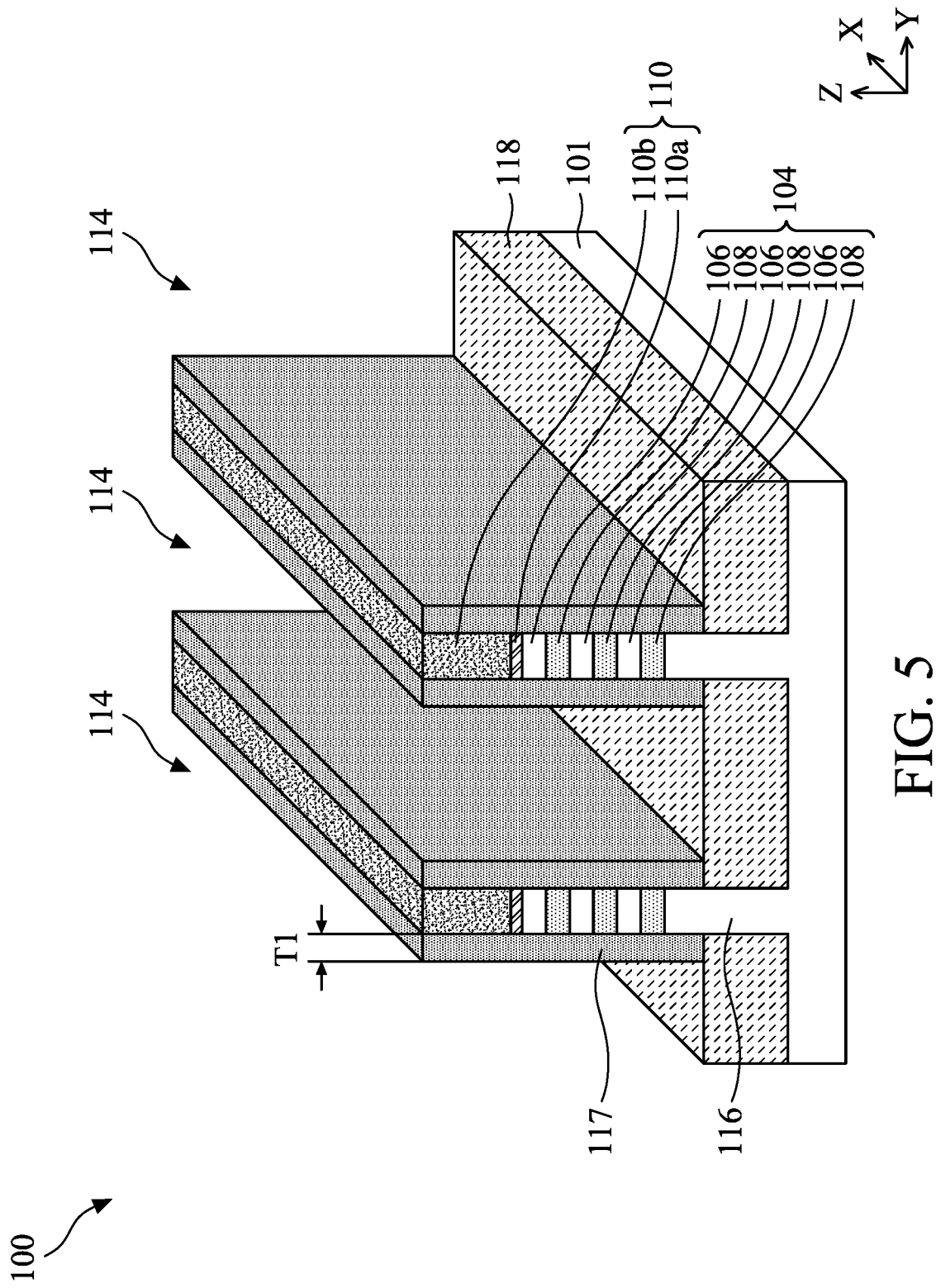

In FIG. 5, portions of the cladding layer 117 are removed to expose the mask structure 110 (e.g., hard mask 110b) and the insulating material 118. The removal of the portion of the cladding layer 117 may be performed by any suitable process, such as dry etch, wet etch, or a combination thereof. In some embodiments, the removal process is an anisotropic etch process which removes the cladding layer 117 on horizontal surfaces of the fin structures 112 and the insulating material 118, while the cladding layer 117 on the sidewalls of the fin structures 112 remain substantially intact after the removal process. The thickness T1 of the cladding layer 117 formed on the sidewalls of the fin structures 112 is selected to define the space suitable for a subsequent gate electrode layer around the nanosheet channels of the nanosheet FET device. In some embodiments, the thickness T1 may be in a range between about 1 nm and about 15 nm. If the thickness T1 of the cladding layer 117 is less than 1 nm, the space created by the subsequent removal of the cladding layer 117 may be too small to form the gate electrode layer. On the other hand, if the thickness of the cladding layer 117 is greater than 15 nm, the manufacturing cost is increased without significant advantage.

In some embodiments, the removal process is performed so that only the cladding layer 117 on the insulating material 118 is removed. The cladding layer 117 on the horizontal and vertical surfaces of the fin structures 112 remain substantially intact.

Figure 6:
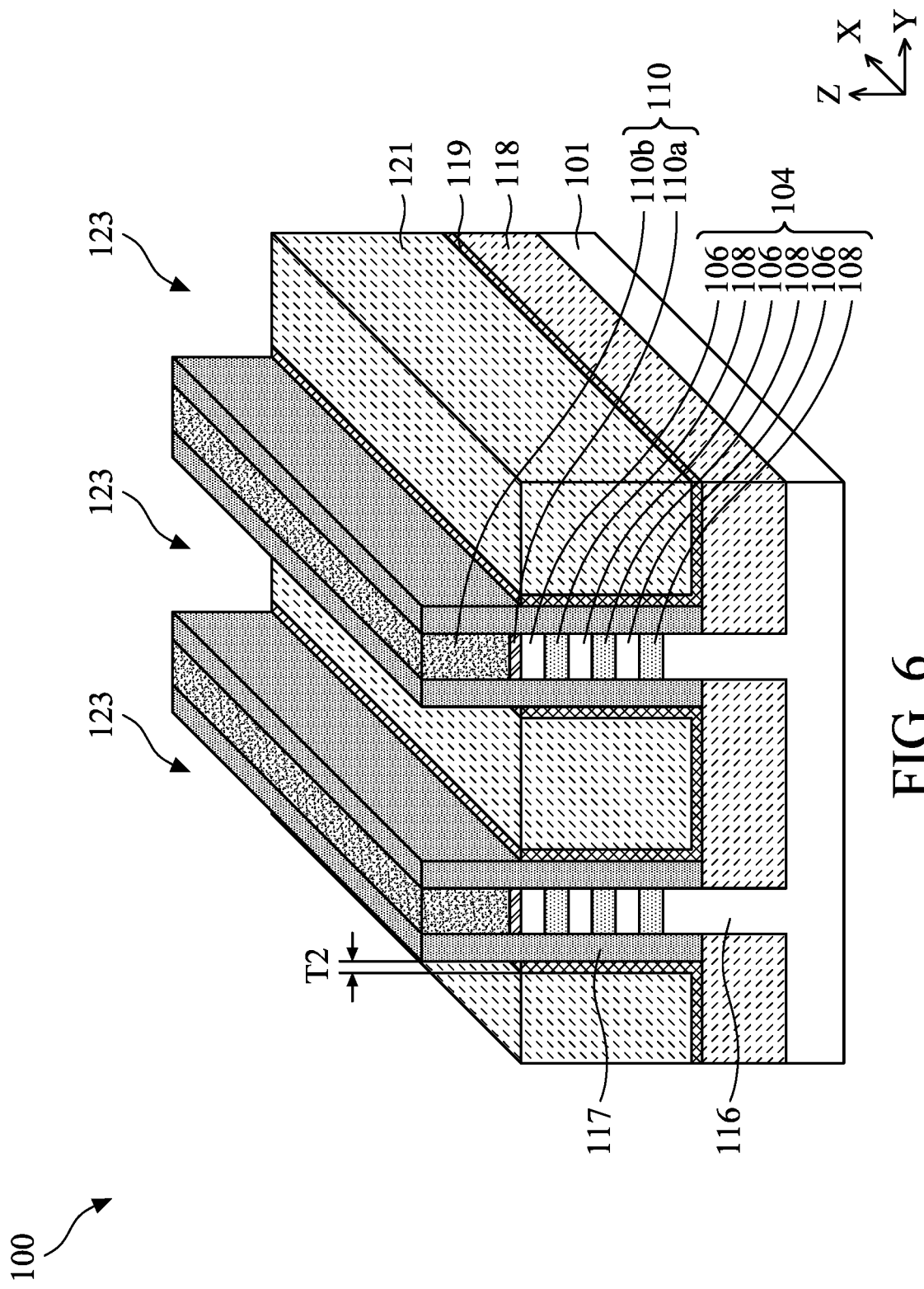

In FIG. 6, a liner 119 is formed on the cladding layer 117 and the top surface of the insulating material 118. In some embodiments, the liner 119 may include a low-k dielectric material (e.g., a material having a k value lower than 7). For example, the liner 119 may be a nitrogen-containing layer, an oxygen-containing layer, or a silicon-containing layer. Exemplary materials may include, but are not limited to, $SiO_2$, SiN, SiCN, SiOC, SiOCN, or the like. In one embodiment, the liner 119 is SiCN. The liner 119 may be formed by a conformal process, such as an ALD process.

The liner 119 may function as an oxidizing blocking layer that reduce the oxidation of the cladding layer 117. The liner 119 also helps to prevent germanium loss from the cladding layer 117. The thickness T2 of the liner 119 formed on the cladding layer 117 is selected to minimize oxidation of the cladding layer 117. In some embodiments, the thickness T2 may be in a range between about 4 nm and about 6 nm, for example about 4.5 nm. In cases where cladding layer 117 is formed of amorphous SiGe, it has been observed that germanium loss is more susceptible than crystalline SiGe due to the presence of a great number of dangling bonds in the amorphous SiGe which has less binding energy than that of covalent bonds in the crystalline SiGe. Therefore, germanium may diffuse out of the cladding layer 117 (and becoming a low Ge % cladding layer 117) and react with oxygen ($O_2$) to form germanium oxide ($GeO_2$). The germanium oxide may react with silicon diffused from the first semiconductor layer 106 and/or substrate 101 during the subsequent thermal treatment (e.g., anneal process) and be reduced to germanium piling up at regions along interfaces between the fin structures 112 and the cladding layer 117. The low Ge % cladding layer 117 and germanium piled up at regions along interfaces between the fin structures 112 and the cladding layer 117 may lead to underetching of the cladding layer 117 during recessing of the second semiconductor layers 108 and formation of the nanosheet channels. When the cladding layer 117 is underetched, a top portion of the cladding layer 117 may show a (concave shape) smiling profile which affects the profile of the dielectric spacers 144 (FIG. 12D) to be formed on the recessed cladding layer 117 in the subsequent process. Therefore, if the thickness T2 of the liner 119 is less than 4 nm, the liner 119 might not function properly to minimize the oxidation of the cladding layer 117 and prevent germanium loss from the cladding layer 117. On the other hand, if the thickness of the liner 119 is greater than 6 nm, the manufacturing cost is increased without significant advantage.

After the liner 119 is formed, a dielectric material 121 is formed in the trenches 114 (FIG. 5) and on the liner 119. The dielectric material 121 may be an oxygen-containing material, such as an oxide, formed by FCVD. The oxygen-containing material may have a k value less than about 7, for example less than about 3. In some embodiments, after the dielectric material 121 is deposited, an anneal process may be performed on the dielectric material 121. Then, a second dielectric material (not shown) may be formed on the annealed dielectric material 121. The second dielectric material may have a thickness less than the thickness of the dielectric material 121. For example, the second dielectric material may have a thickness that is about ⅓ of the thickness of the dielectric material 121. The second dielectric material may be formed by PECVD. A planarization process, such as a CMP process, may be performed to remove portions of the liner 119, the second dielectric material (if used), and a portion of the dielectric material 121 formed over the fin structures 112. The portion of the cladding layer 117 disposed on the hard mask 110b is exposed after the planarization process.

Next, the liner 119 and the dielectric material 121 are recessed using any suitable process to the level of the topmost first semiconductor layer 106 (or slightly below). For example, in some embodiments, after the recess process, the top surfaces of the liner 119 and the dielectric material 121 may be recessed to level with a top surface of the topmost first semiconductor layer 106. The etch processes may be selective etch processes that do not remove the semiconductor material of the cladding layer 117 and the hard mask 110b. As a result of the recess process, trenches 123 are formed between the fin structures 112, as shown in FIG. 6.

Figure 7:
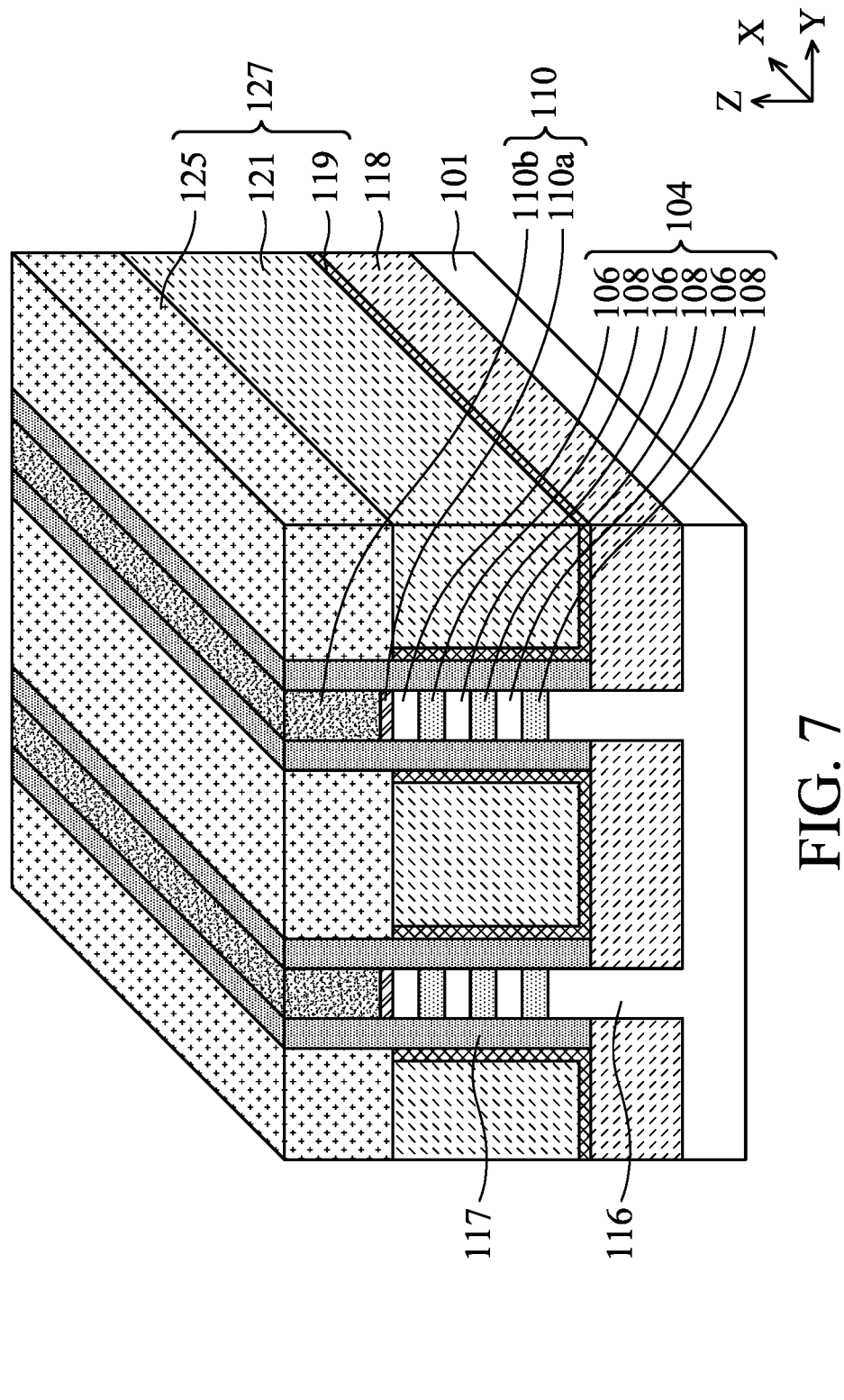

In FIG. 7, a dielectric material 125 is formed in the trenches 123 (FIG. 6) and on the dielectric material 121 and the liner 119. The dielectric material 125 may include SiO, SiN, SiC, SiCN, SiON, SiOCN, AlO, AlN, AlON, ZrO, ZrN, ZrAlO, HfO, or other suitable dielectric material. In some embodiments, the dielectric material 125 includes a high-k dielectric material (e.g., a material having a k value greater than 7). The dielectric material 125 may be formed by any suitable process, such as a CVD, PECVD, FCVD, or ALD process. A planarization process, such as a CMP process, is then performed until the hard mask 110b of the mask structure 110 is exposed. The planarization process removes portions of the dielectric material 125 (and the cladding layer 117 disposed over the mask structure 110 in cases where the cladding layer 117 on the horizontal surface of the fin structures 112 was not removed). The liner 119, the dielectric material 121, and the dielectric material 125 together may be referred to as a dielectric feature 127 or a hybrid fin. The dielectric feature 127 serves as a dielectric fin that separates subsequent source/drain (S/D) epitaxial features and adjacent gate electrode layers.

In some embodiments, after the planarization process to remove portions of the dielectric material 125, the semiconductor device structure 100 is subjected to a thermal treatment. The thermal treatment may help crystallize the dielectric material 125 so that the dielectric material 125 can withstand the etchants used during subsequent removal of the sacrificial gate structure 130 (e.g., FIG. 16B). The thermal treatment may be performed in-situ or ex-situ and can be any type of anneal, such as rapid thermal anneal, a spike anneal, a soak anneal, a laser anneal, a furnace anneal, etc. The thermal treatment may be performed for about 10 seconds to about 5 minutes, such as about 20 seconds to about 90 seconds, and at a lower temperature (e.g., below 900° C.), for example in a temperature range of about 600° C. and about 850° C., such as about 680° C. to about 750° C. In one embodiment, the thermal treatment is a spike anneal performed at a temperature of about 700° C. for about 30 seconds. If the thermal treatment is performed below 600° C., the dielectric material 125 may not be crystallized and provide mechanical strength sufficient to withstand the etchants used during the removal of the sacrificial gate structure 130. On the other hand, if the thermal treatment is performed at a temperature above 850° C. (e.g., above 900° C.), the thermal budget left for the subsequent processes is reduced which may affect performance of the devices formed after. The lower temperature will also help with germanium preservation in the cladding layer 117, thereby improving smiling profile at the top portion of the cladding layer 117 during the subsequent removal process.

The thermal treatment may be performed in an atmosphere of gas, such as a hydrogen-containing gas, an argon-containing gas, a helium-containing gas, or any combinations thereof. Exemplary gas may include, but are not limited to, $N_2$, $NH_3$, $O_2$, $N_2O$, Ar, He, H, etc.

Figure 8:
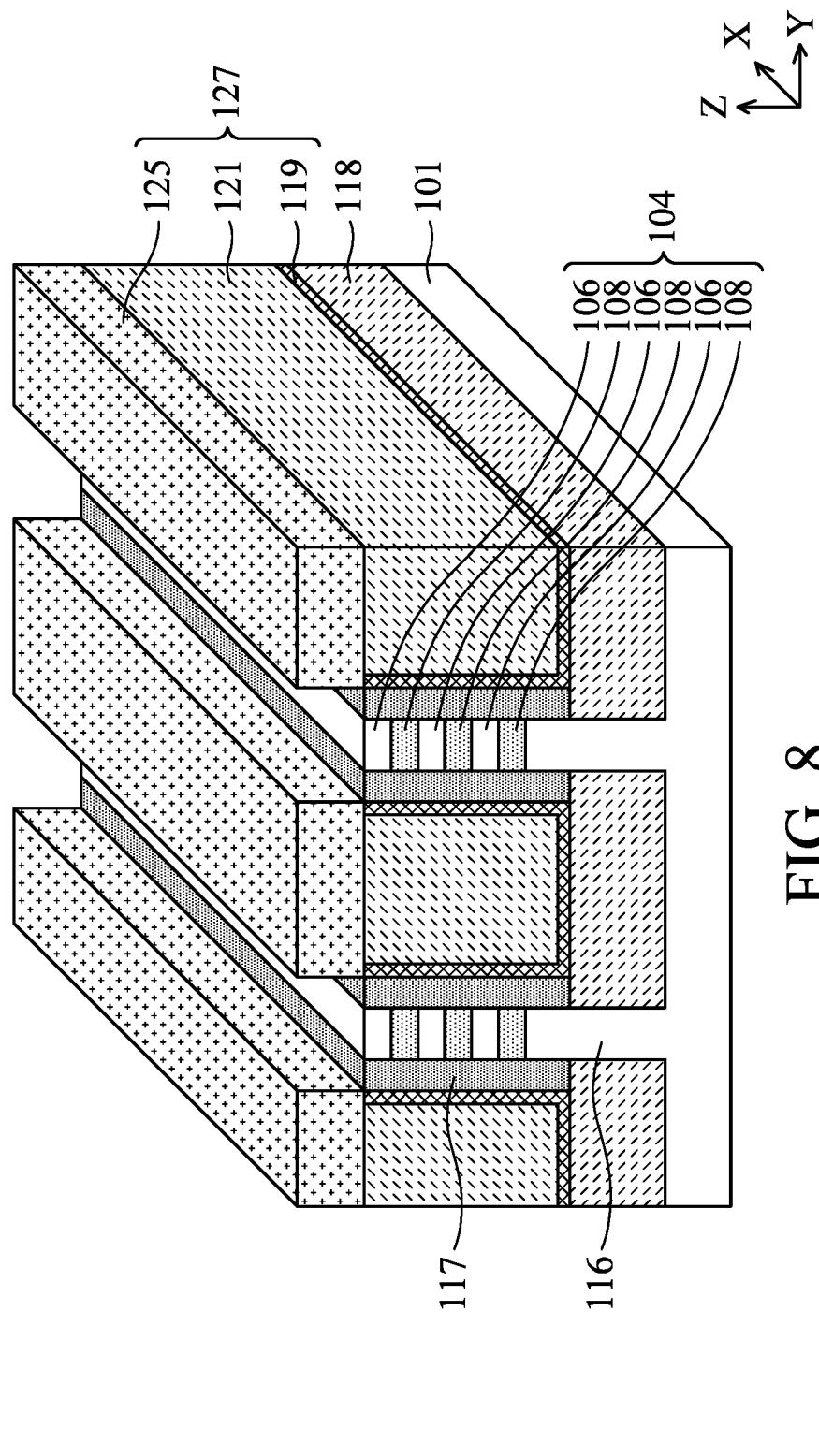

In FIG. 8, the cladding layers 117 are recessed, and the mask structures 110 are removed. The recess of the cladding layers 117 may be performed by any suitable process, such as dry etch, wet etch, or a combination thereof. The recess process may be controlled so that the remaining cladding layers 117 are substantially at the same level as the top surface of the topmost first semiconductor layer 106 in the stack of semiconductor layers 104. The etch process may be a selective etch process that does not remove the dielectric material 125. The removal of the mask structures 110 may be performed by any suitable process, such as dry etch, wet etch, or a combination thereof.

Figure 9:
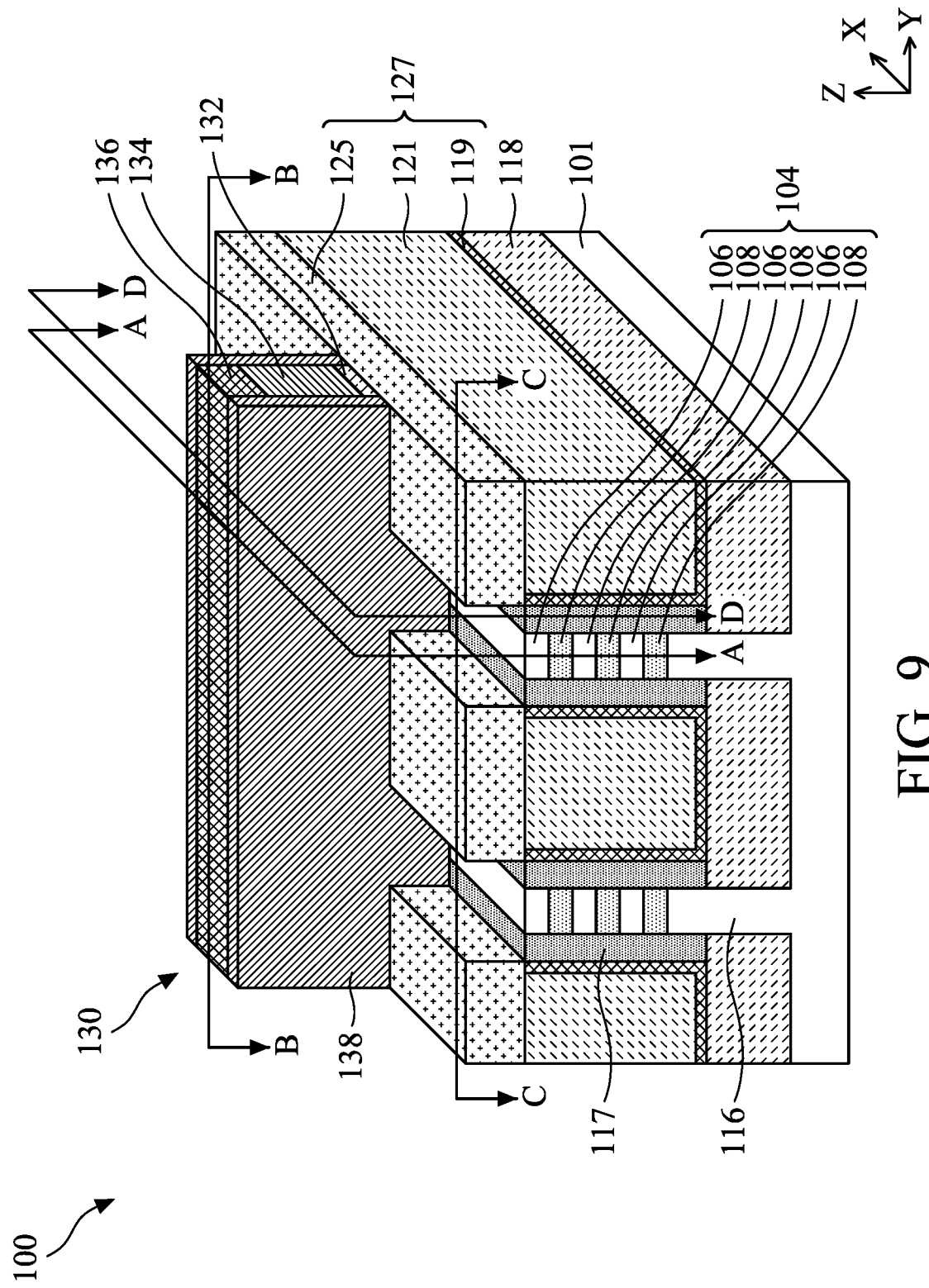

In FIG. 9, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof.

In some embodiments, which can be combined with any one or more embodiments of this disclosure, after formation of the sacrificial gate dielectric layer 132, the semiconductor device structure 100 is proceeded to form the sacrificial gate electrode layer 134 on the sacrificial gate dielectric layer 132 without performing an anneal process. That is, the sacrificial gate dielectric layer 132 is not subjected to an anneal process or any thermal treatment. As a result, the thermal budget for various subsequent processes is increased.

By patterning the sacrificial gate structure 130, the stacks of semiconductor layers 104 of the fin structures 112 are partially exposed on opposite sides of the sacrificial gate structure 130. The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. While one sacrificial gate structure 130 is shown, two or more sacrificial gate structures 130 may be arranged along the X direction in some embodiments.

Next, gate spacers 138 are formed on sidewalls of the sacrificial gate structures 130. The gate spacers 138 may be formed by first depositing a conformal layer that is subsequently etched back to form gate spacers 138. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fin structures 112, the cladding layer 117, the dielectric material 125, leaving the gate spacers 138 on the vertical surfaces, such as the sidewalls of sacrificial gate structures 130. The gate spacer 138 may be made of a dielectric material such as silicon oxide, silicon nitride, silicon carbide, silicon oxynitride, SiCN, silicon oxycarbide, SiOCN, and/or combinations thereof.

FIGS. 10A-17A are cross-sectional views of one of the various stages of manufacturing the semiconductor device structure 100 taken along cross-section A-A of FIG. 9, in accordance with some embodiments. FIGS. 10B-17B are cross-sectional side views of the semiconductor device structure 100 taken along cross-section B-B of FIG. 9, in accordance with some embodiments. FIGS. 10C-17C are cross-sectional views of one of the various stages of manufacturing the semiconductor device structure 100 taken along cross-section C-C of FIG. 9, in accordance with some embodiments. FIGS. 10D-12D are cross-sectional views of one of the various stages of manufacturing the semiconductor device structure 100 taken along cross-section D-D of FIG. 9, in accordance with some embodiments. Cross-section A-A is in a plane of the fin structure 112 along the X direction. Cross-section B-B is in a plane perpendicular to cross-section A-A and is in the sacrificial gate structure 130. Cross-section C-C is in a plane perpendicular to cross-section A-A and is in the epitaxial S/D features 146 (FIG. 13C) along the Y-direction. Cross-section D-D is in a plane of the cladding layer 117 along the X direction.

Figure 10D:
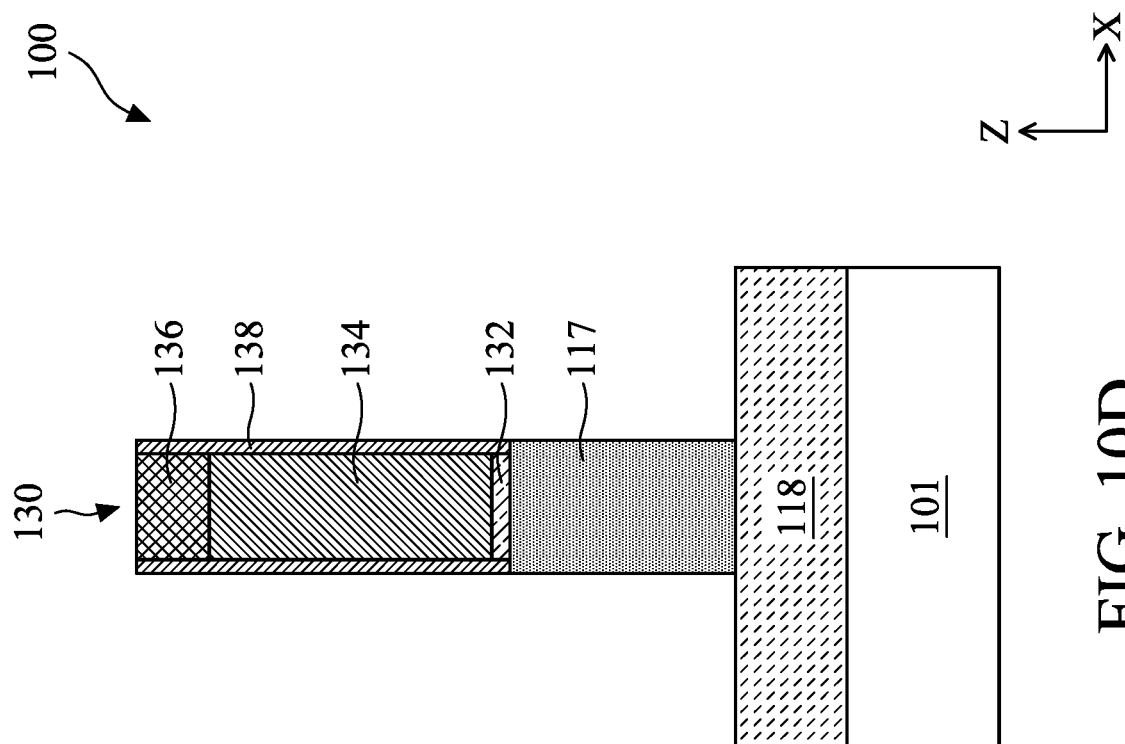
Figure 10C:
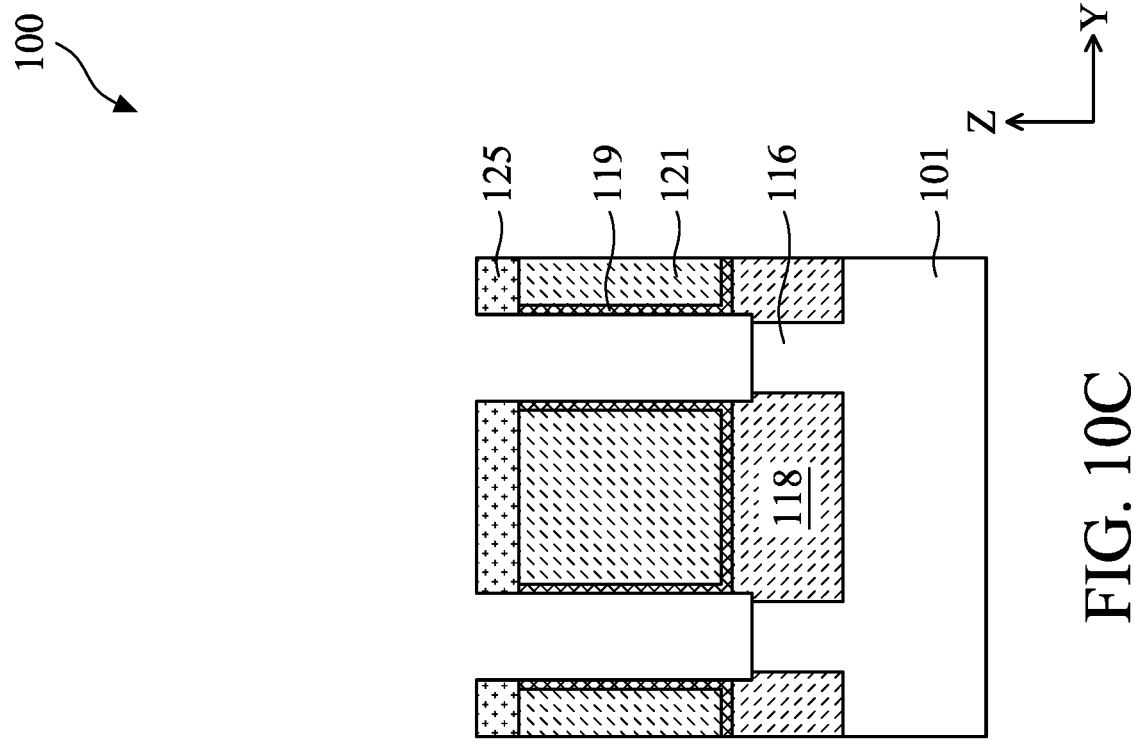

In FIGS. 10A-10D, exposed portions of the fin structures 112, exposed portions of the cladding layers 117, and exposed portions of the dielectric material 125 not covered by the sacrificial gate structures 130 and the gate spacers 138 are selectively recessed by using one or more suitable etch processes, such as dry etch, wet etch, or a combination thereof. In some embodiments, exposed portions of the stacks of semiconductor layers 104 of the fin structures 112 are removed, exposing portions of the well portions 116. As shown in FIG. 10A, the exposed portions of the fin structures 112 are recessed to a level at or slightly below the bottom surface of the second semiconductor layer 108 in contact with the well portion 116 of the substrate 101. The recess processes may include an etch process that recesses the exposed portions of the fin structures 112 and the exposed portions of the cladding layers 117.

In FIGS. 11A-11D, edge portions of each second semiconductor layer 108 of the stack of semiconductor layers 104 are removed horizontally along the X direction. The removal of the edge portions of the second semiconductor layers 108 forms cavities 141. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

During the recess etching of the second semiconductor layer 108, end portions of the cladding layer 117 are also horizontally etched along the X direction. In some embodiments, the etched amount of the cladding layer 117 is greater than the recessed amount of the second semiconductor layers 108. Since the thickness "T2" of the liner 119 is controlled to minimize germanium loss from the cladding layer 117, the underetch of the cladding layer 117 during the recess etching is minimized, resulting in the cladding layer 117 with different profiles at the top portion 117$t$ and the bottom portion 117$b$ of the cladding layer 117. For example, the etching of the end portions of the cladding layer 117 may form curved cavities 135 in the X-Z plane of the semiconductor device structure 100. The curved cavities 135 are substantially symmetric with respect to a longitudinal axis of the sacrificial gate structure 130. Stated differently, the top portion 117$t$ of the cladding layer 117 may have a curved surface having a first radius (Re) of curvature 137 and the bottom portion 117$b$ of the cladding layer 117 may have a curved surface having a second radius (Re) of curvature 139 that is greater than the first radius (Re) of curvature 137. In some embodiments, the ratio of the first radius (Re) of curvature 137 to the second radius (Re) of curvature 139 may be in the range of about 0.5 to about 0.9, for example about 0.6 to about 0.8. While not wishing to be bound by any particular theory, the difference between the first and second radius (Re) of curvatures 137, 139 may be partly due to the top portion 117$t$ being exposed to a greater amount of the etchant during the etch process than that of the bottom portion 117$b$. As will be discussed in more detail below, the radius (Re) of curvatures of the top and bottom portions 117$t$, 117$b$ affect the profile of the dielectric spacers 144 (FIG. 12E) to be formed in the curved cavities 135 of the cladding layer 117.

In FIGS. 12A-12D, after removing edge portions of each second semiconductor layers 108, a dielectric layer is deposited in the cavities 141 (FIG. 11A) formed in the edge portions of the second semiconductor layers 108 and the recessed, curved cavities 135 (FIG. 11D) of the cladding layer 117 to form dielectric spacers 144. The dielectric spacers 144 may be made of a low-k dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. Portions of the dielectric spacers 144 are protected by the first semiconductor layers 106 during the anisotropic etching process. The remaining second semiconductor layers 108 are capped between the dielectric spacers 144 along the X direction.

Figure 11B:
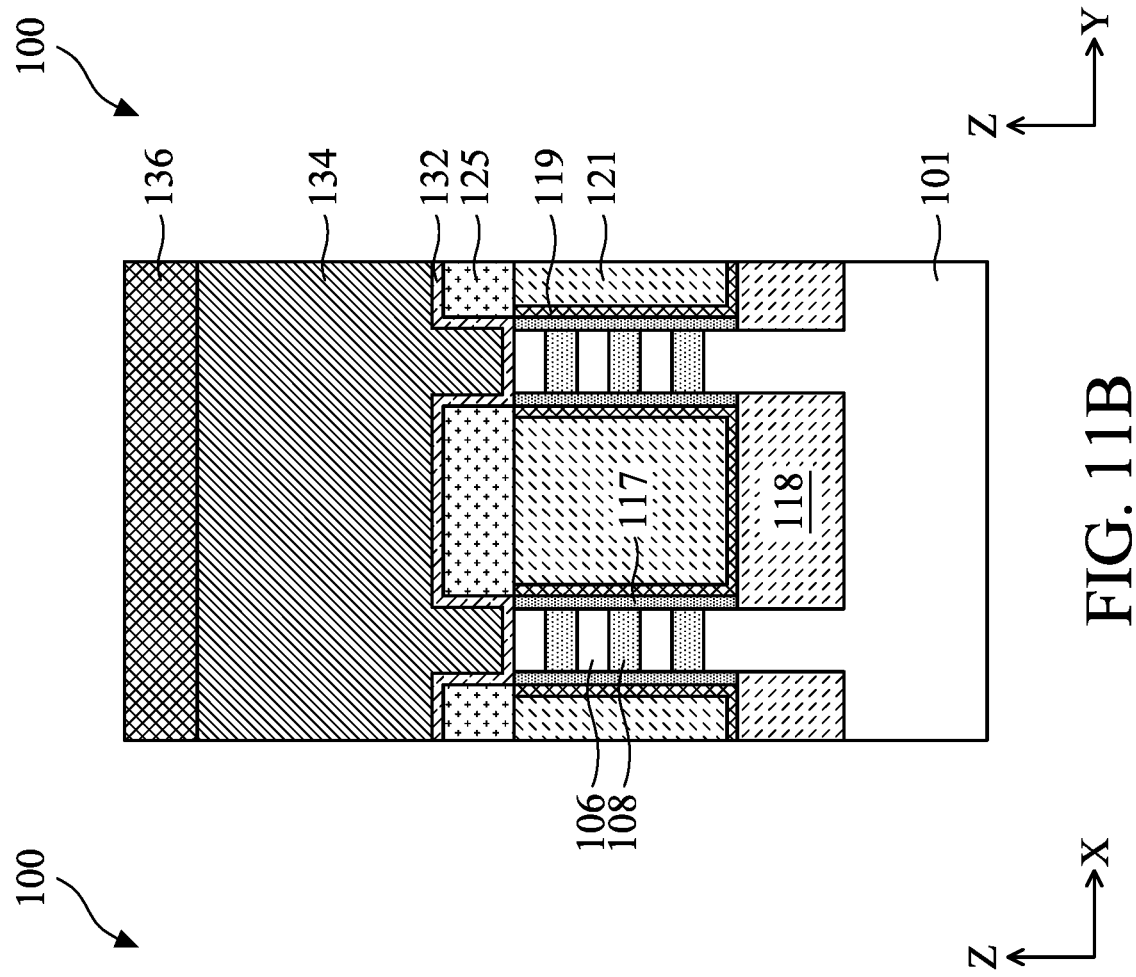
Figure 11A:
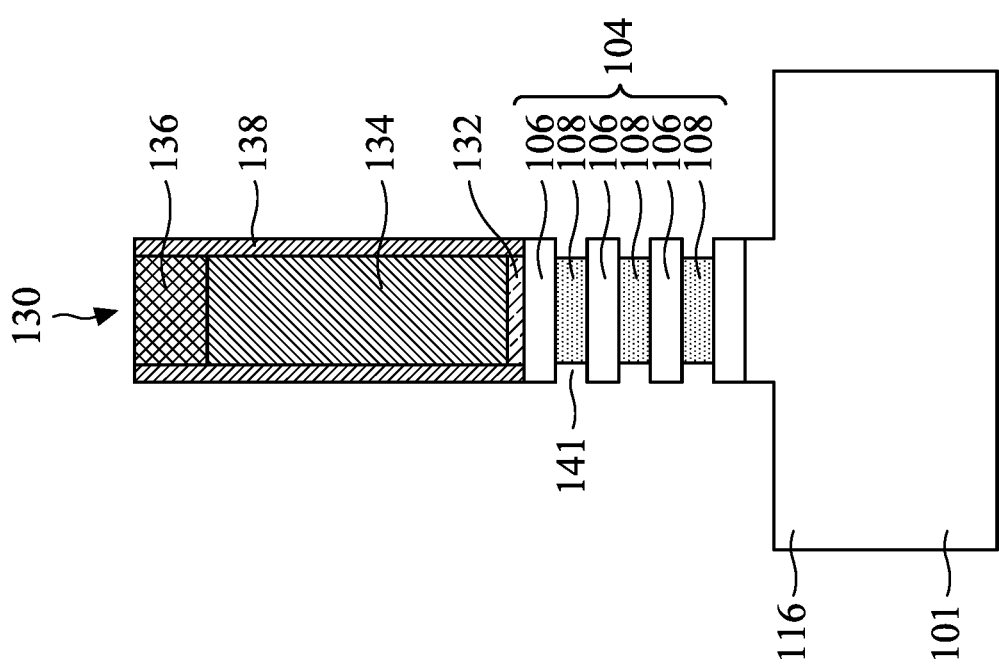
Figure 11D:
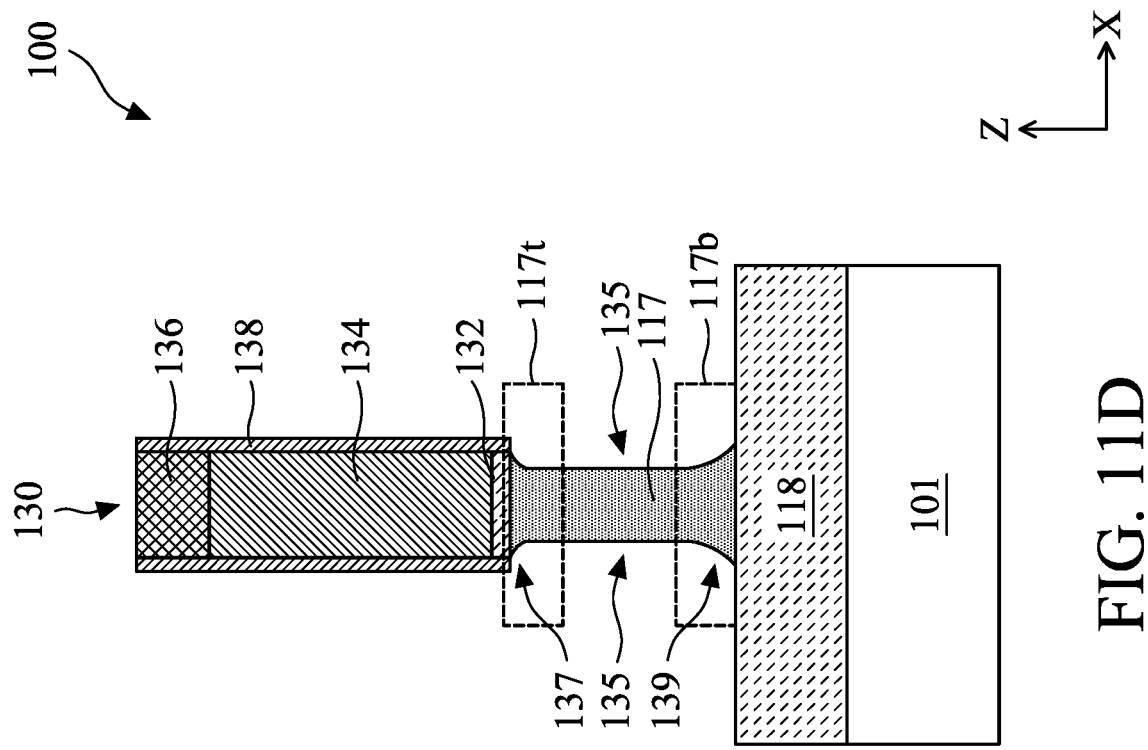
Figure 11C:
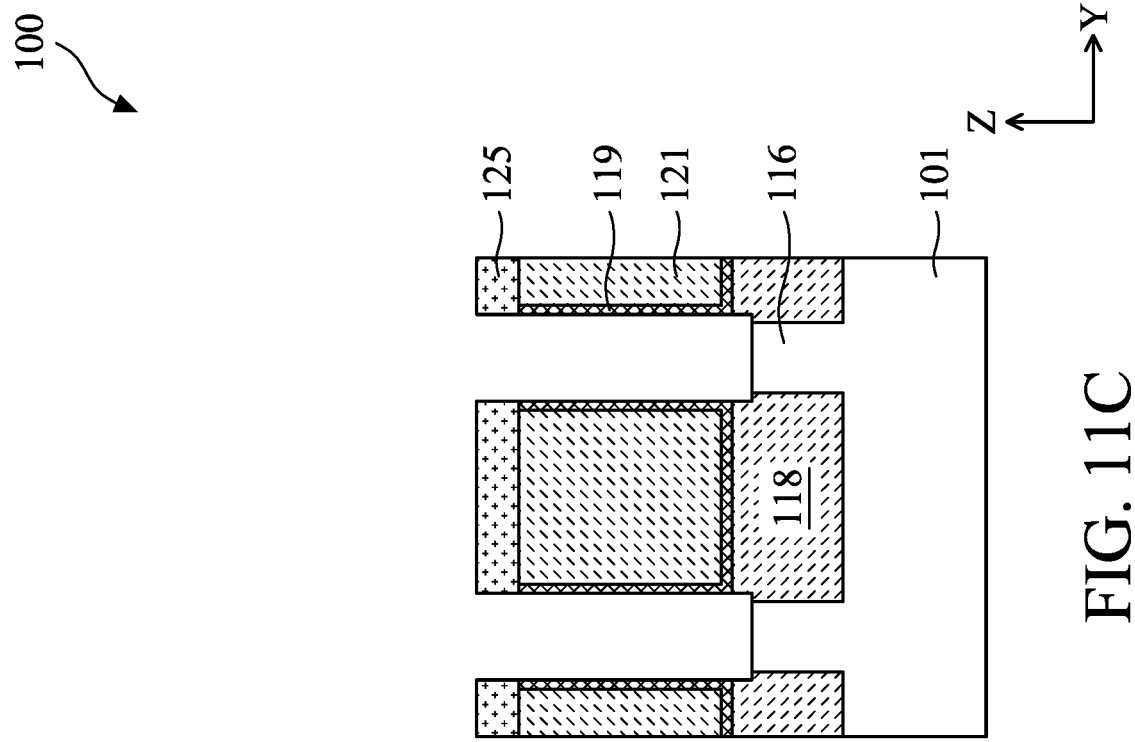
Figure 12E:
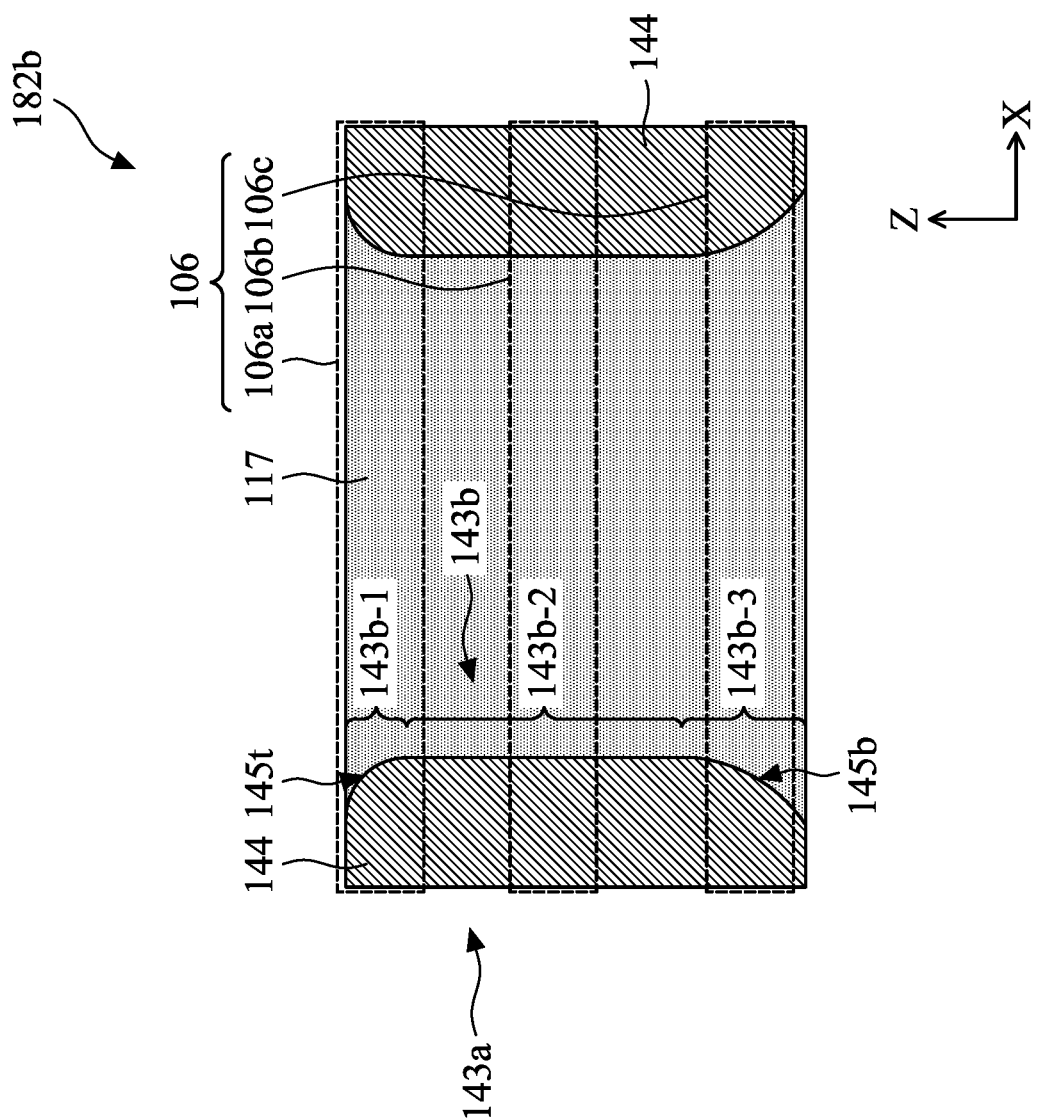
FIG. 12E is an enlarged view of a portion of the semiconductor device structure of FIG. 12D, in accordance with some embodiments.

The dielectric spacers 144 in contact with the cladding layer 117 are formed in accordance with the profile of the curved cavity 135 formed in the cladding layer 117. In some embodiments, each dielectric spacer 144 is formed to have a first side 143*a* that is under and substantially flush with the gate spacers 138, and a second side 143*b* that is opposite the first side 143*a*. The first side 143*a* has a substantially flat surface. The second side 143*b* is shaped in accordance with the profile of the top and bottom portions 117*t*, 117*b* of the cladding layer 117. The term "being substantially flush" herein means the difference in the relative position is less than about 1 nm. FIG. 12E is an enlarged view of a portion of the semiconductor device structure 100 of FIG. 12D, showing the positional relationship between the dielectric spacer 144 and the layers adjacent the dielectric spacer 144, in accordance with some embodiments. In FIG. 12E, the second side 143*b* of the dielectric spacer 144 includes an upper section 143*b*-1 adjacent the gate spacers 138 and in contact with the first semiconductor layer 106 (e.g., first semiconductor layer 106*a* represented by dotted lines), and a lower section 143*b*-3 adjacent the insulating material 118 and in contact with the first semiconductor layer 106 (e.g., first semiconductor layer 106*c* represented by dotted lines). The second side 143*b* of the dielectric spacer 144 also includes a middle section 143*b*-2 between the upper section 143*b*-1 and the lower section 143*b*-3 of the second side 143*b*. The middle section 143*b*-2 is substantially flat. In some embodiments, the upper section of the second side 143*b* has a first radius (Re) of curvature 145*t* and the lower section of the second side 143*b* has a second radius (Re) of curvature 145*b* greater than the first radius (Re) of curvature 145*t*. The first radius (Re) of curvature 145*t* corresponds to the first radius (Re) of curvature 137 of the top portion 117*t* of the cladding layer 117 (FIG. 11D), and the second radius (Re) of curvature 145*b* corresponding to the second radius (Re) of curvature 139 of the bottom portion 117*b* of the cladding layer 117 (FIG. 11D).

Figure 13C:
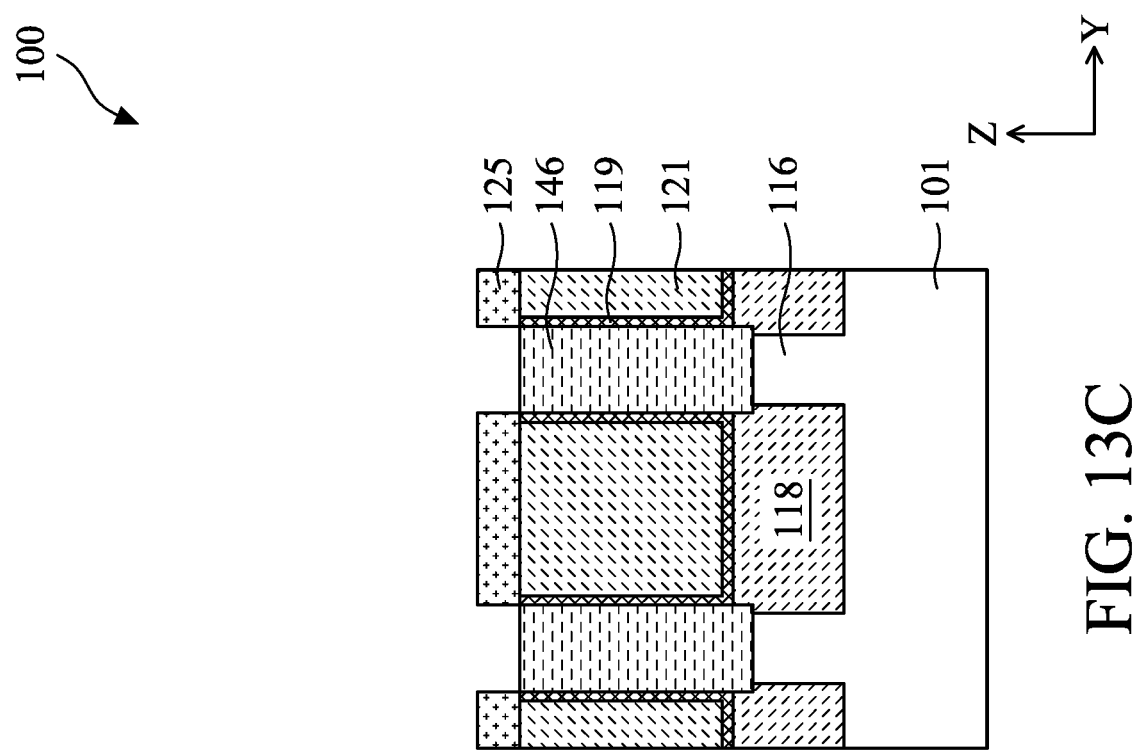

In FIGS. 13A-13C, epitaxial S/D features 146 are formed on the well portion 116 of the fin structures 112. The epitaxial S/D feature 146 may include one or more layers of Si, SiP, SiC and SiCP for an n-type FET or Si, SiGe, Ge for a p-type FET. The epitaxial S/D features 146 may grow both vertically and horizontally to form facets, which may correspond to crystalline planes of the material used for the substrate 101. The epitaxial S/D features 146 are formed by an epitaxial growth method using CVD, ALD or MBE. The epitaxial S/D features 146 are in contact with the first semiconductor layers 106 and dielectric spacers 144. The epitaxial S/D features 146 may be the S/D regions. For example, one of a pair of epitaxial S/D features 146 located on one side of the sacrificial gate structures 130 can be a source region, and the other of the pair of epitaxial S/D features 146 located on the other side of the sacrificial gate structures 130 can be a drain region. A pair of epitaxial S/D features 146 includes a source epitaxial feature 146 and a drain epitaxial feature 146 connected by the channels (i.e., the first semiconductor layers 106). In this disclosure, a source and a drain are interchangeably used, and the structures thereof are substantially the same.

Figure 14C:
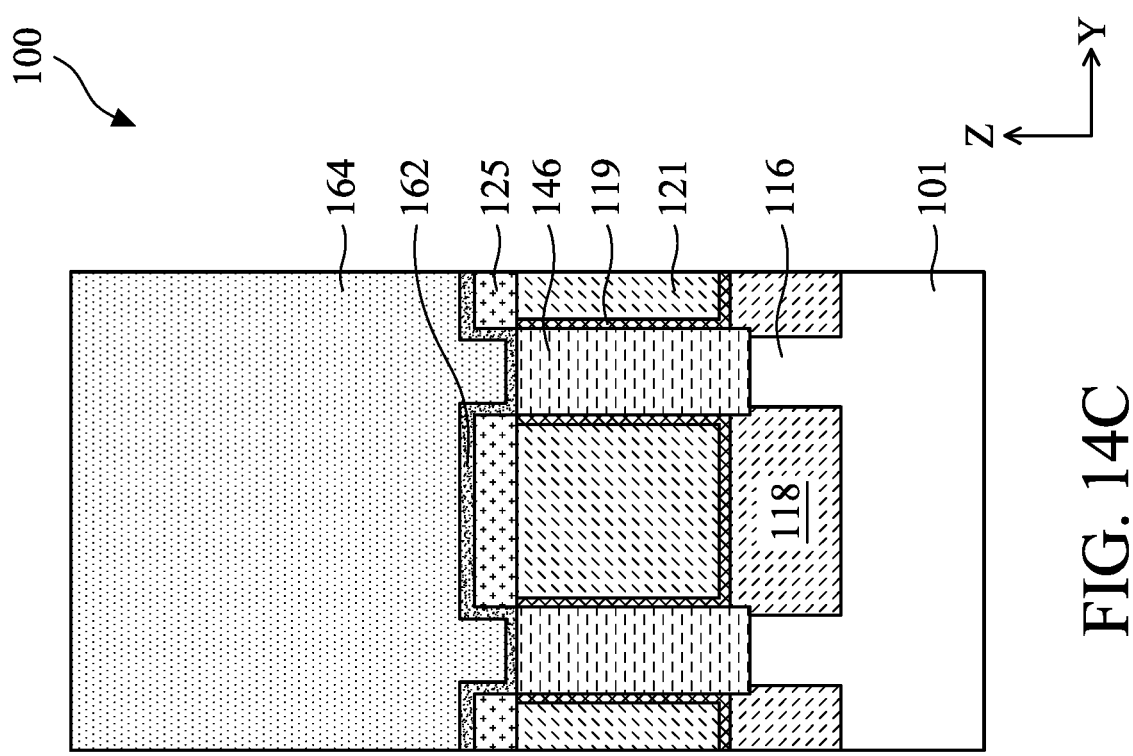

In FIGS. 14A-14C, after formation of the epitaxial S/D features 146, a contact etch stop layer (CESL) 162 is conformally formed on the exposed surfaces of the semiconductor device structure 100. The CESL 162 covers the epitaxial S/D features 146, the gate spacers 138, the dielectric material 125, and the exposed surface of the stack of semiconductor layers 104. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 164 is formed on the CESL 162 over the semiconductor device structure 100. The materials for the ILD layer 164 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials comprising Si, 0, C, and/or H. The ILD layer 164 may be deposited by a PECVD process or other suitable deposition technique. In some embodiments, after formation of the ILD layer 164, the semiconductor device structure 100 may be subject to a thermal process to anneal the ILD layer 164.

Figure 15C:
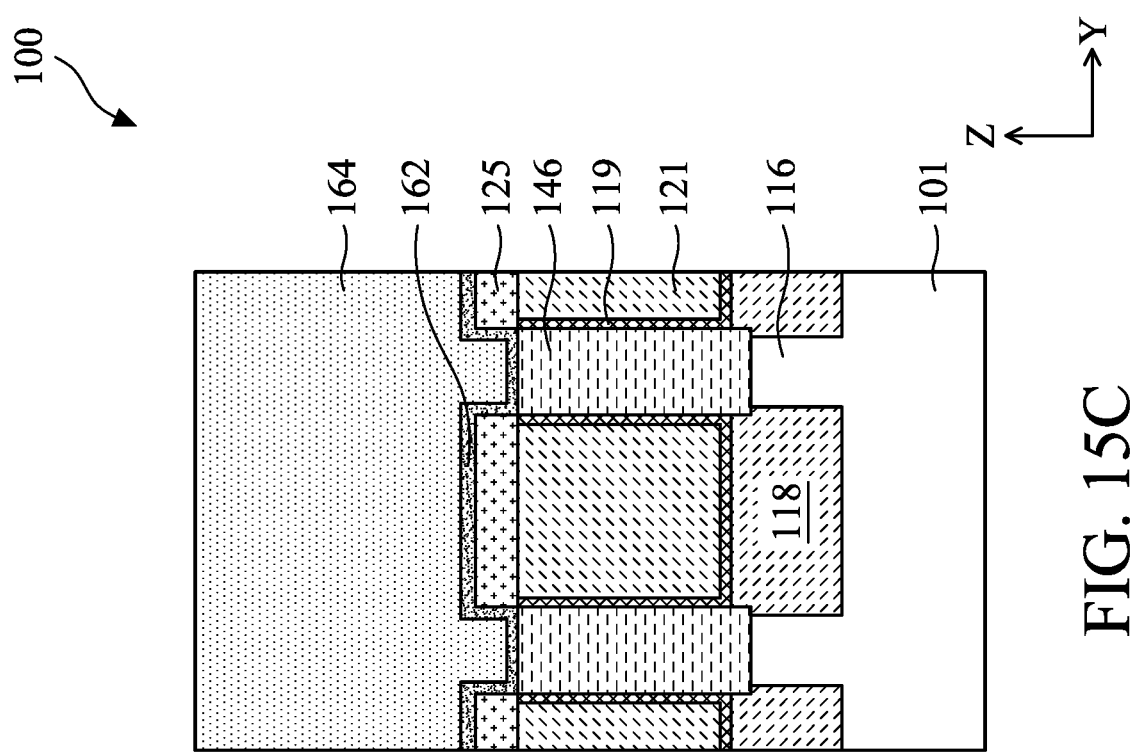

In FIGS. 15A-15C, after the ILD layer 164 is formed, a planarization operation, such as CMP, is performed on the semiconductor device structure 100 to remove portions of the ILD layer 164, the CESL 162 and the mask layer 136 until the sacrificial gate electrode layer 134 is exposed.

Figure 16C:
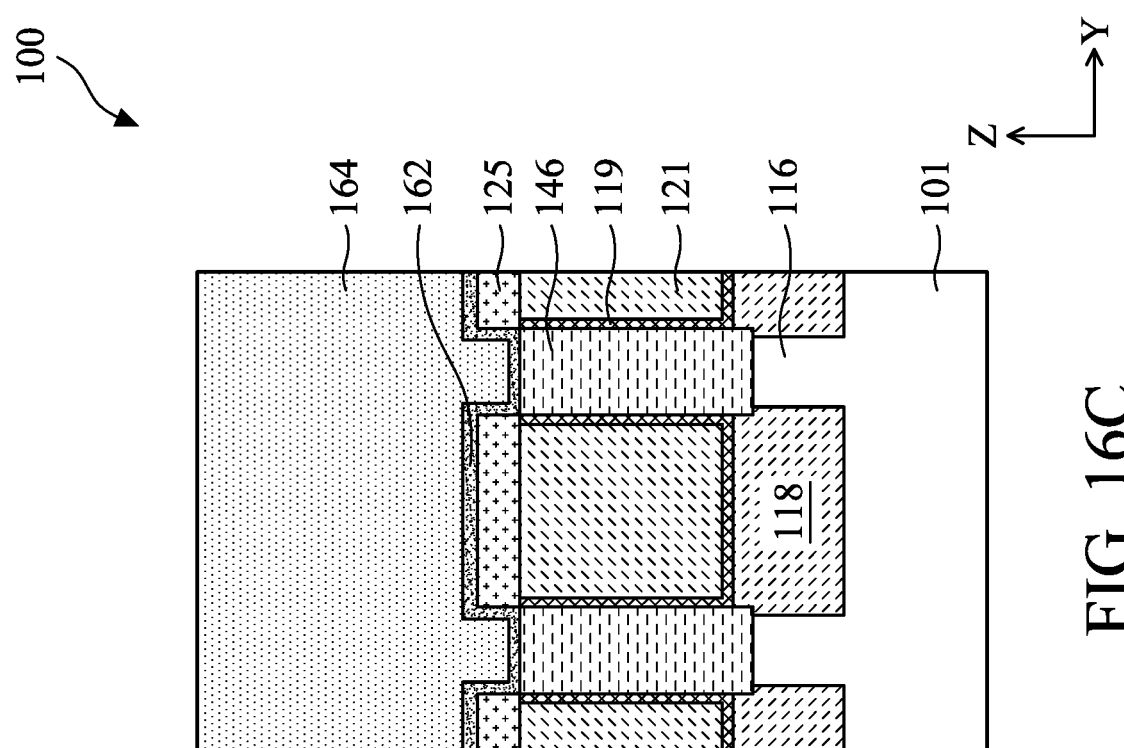

In FIGS. 16A-16C, the sacrificial gate structure 130 is removed. The removal of the sacrificial gate structure 130 forms a trench 166 in the regions where the sacrificial gate electrode layer 134 and the sacrificial gate dielectric layer 132 were removed. The trench 166 exposes portions of the cladding layer 117 and the top of the first semiconductor layer 106. The ILD layer 164 protects the epitaxial S/D features 146 during the removal of the sacrificial gate structure 130. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the dielectric material 125, and the CESL 162. In some embodiments, the gate spacers 138 may be recessed by the etchant used to remove the sacrificial gate electrode layer 134 and/or the sacrificial gate dielectric layer 132.

In FIGS. 17A-17C, the cladding layers 117 and the second semiconductor layers 108 are removed. The removal of the cladding layers 117 and the second semiconductor layers 108 exposes the dielectric spacers 144 and the first semiconductor layers 106. The removal process may be any suitable etch processes, such as dry etch, wet etch, or a combination thereof. The etch process may be a selective etch process that removes the cladding layers 117 (FIG. 14B) and the second semiconductor layers 108 but not the gate spacers 138, the CESL 162, the dielectric material 125, and the first semiconductor layers 106. As a result, openings 151 are formed around the first semiconductor layers 106, and the portion of the first semiconductor layers 106 not covered by the dielectric spacers 144 is exposed to the openings 151. FIG. 17D further illustrates the dielectric spacers 144 being exposed to the openings 151 in accordance with some embodiments.

Figure 18:
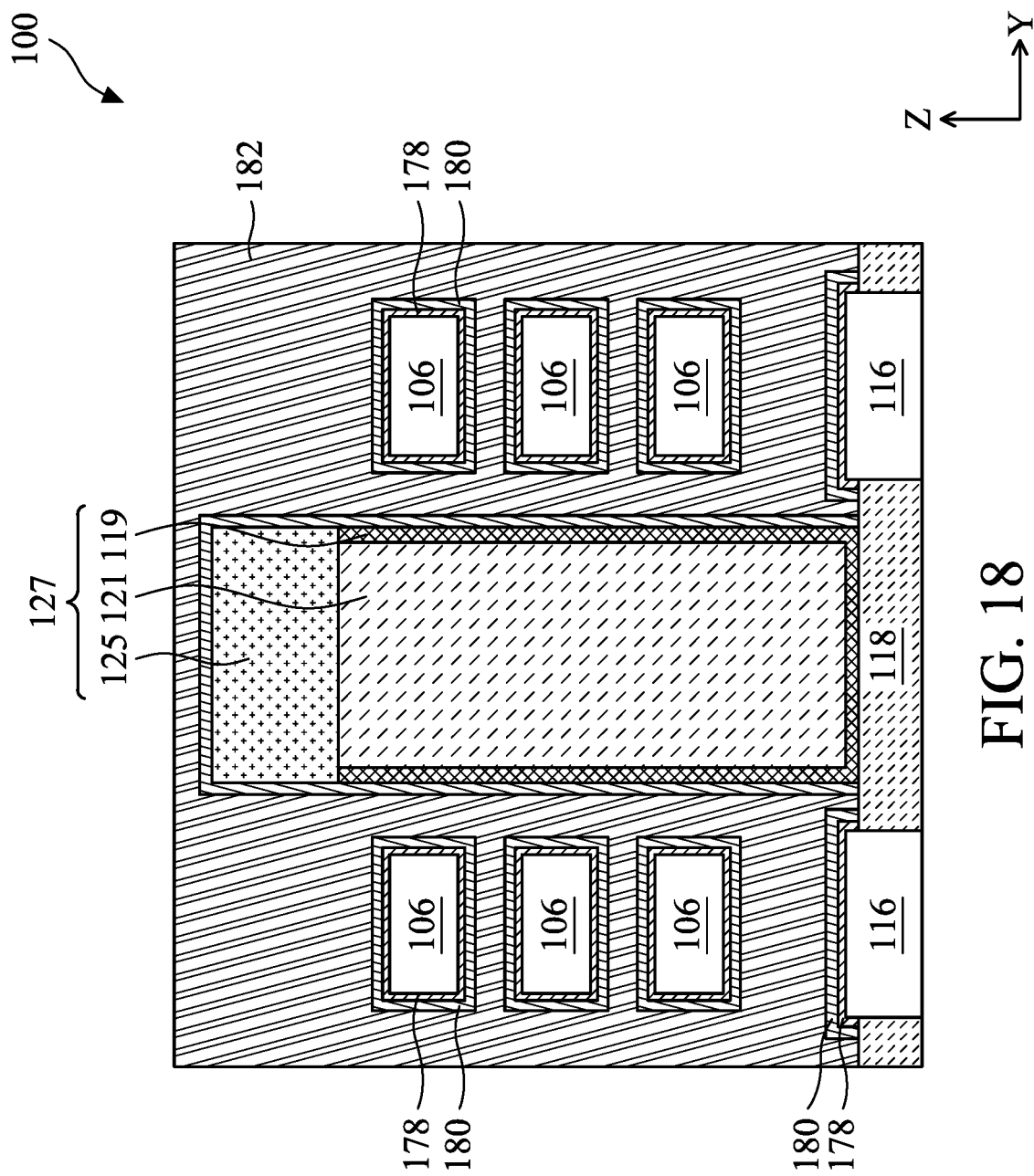
FIG. 18 is an enlarged view of a region of FIG. 17B showing various stages of manufacturing the semiconductor device structure, in accordance with some embodiments.

FIG. 18 is an enlarged view of a region 147 of FIG. 17B showing various stages of manufacturing the semiconductor device structure 100 in accordance with some embodiments. In FIG. 18, an interfacial layer (IL) 178 is formed to surround surfaces of the first semiconductor layers 106. The IL 178 may also form on the exposed surfaces of the well portion 116 of the substrate 101. The IL 178 may include or be made of an oxygen-containing material or a silicon-containing material, such as silicon oxide, silicon oxynitride, oxynitride, hafnium silicate, etc. In some embodiments, the IL 178 is formed by CVD, ALD or any suitable conformal deposition technique. In some embodiments, the IL 178 is formed by subjecting the first semiconductor layers 106 and well portion 116 of the substrate 101 to a wet cleaning process to oxidize a surface portion of the first semiconductor layers 106.

Next, a high-k (HK) dielectric layer 180 is formed on the exposed surfaces of the semiconductor device structure 100. In some embodiments, the HK dielectric layer 180 is formed on the IL 178, a portion of the insulating material 118, and on the exposed surfaces of the dielectric feature 127 (e.g., the liner 119 and the dielectric material 125), as shown in FIG. 18. As will be discussed in further details, portions of the HK dielectric layer 180 are also in contact with the dielectric spacers 144.

Suitable materials for the HK dielectric layer 180 may include, but are not limited to, SiN, SiON, SiCN, SiOCN, AlSi$_x$O$_y$, Al$_2$O$_3$, or the like. Other suitable high-k materials, such as hafnium oxide (HfO$_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HfTiO), lanthanum oxide (LaO), zirconium oxide (ZrO), zirconium silicon oxide (ZrSiO), titanium oxide (TiO), tantalum oxide (Ta$_2$O$_5$), yttrium oxide (Y$_2$O$_3$), may also be used. The HK dielectric layer 180 may be formed by any suitable process, such as a CVD, PECVD, FCVD, or ALD process.

After formation of the IL 178 and the HK dielectric layer 180, a gate electrode layer 182 is formed in the openings 151 (FIG. 17B). The gate electrode layer 182 is formed on the HK dielectric layer 180 to surround a portion of each first semiconductor layer 106 and on the HK dielectric layer 180 that is in contact with the dielectric feature 127 and the insulating material 118. The gate electrode layer 182 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 182 may be formed by PVD, CVD, ALD, electro-plating, or other suitable method. The gate electrode layer 182 is formed to a predetermined height above the dielectric feature 127, as shown in FIG. 18.

Figure 19A:
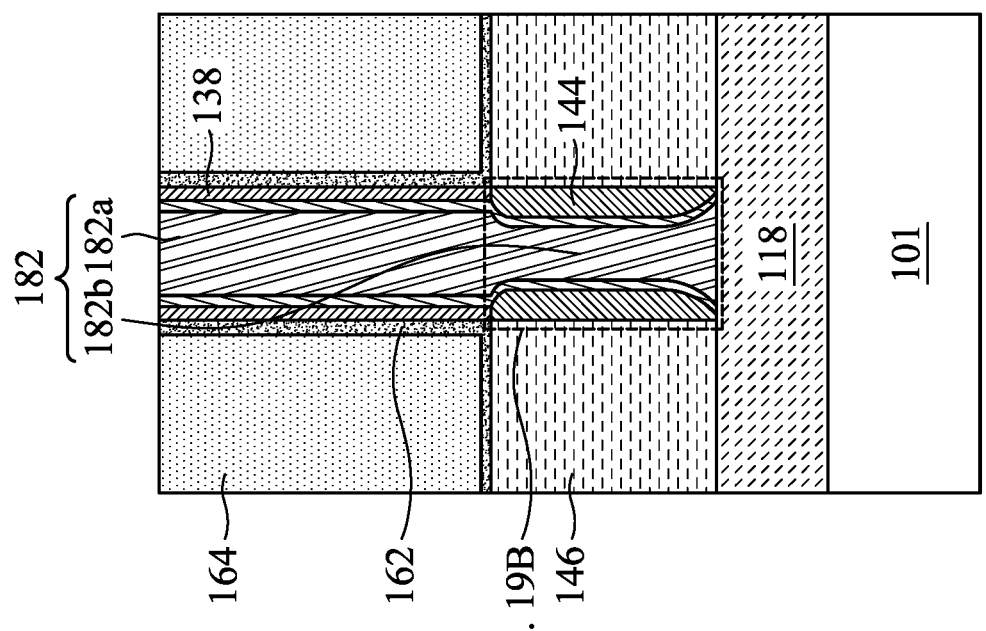
FIG. 19A is a cross-sectional view of one of the various stages of manufacturing the semiconductor device structure taken along cross-section D-D of FIG. 9, in accordance with some embodiments.

FIG. 19A is a cross-sectional view of one of the various stages of manufacturing the semiconductor device structure 100 taken along cross-section D-D of FIG. 9, in accordance with some embodiments. As can be seen in FIG. 19A, the gate electrode layer 182 generally includes a first part 182a and a second part 182b below the first part 182a. The first part 182a of the gate electrode layer 182 is in contact with the HK dielectric layer 180 between the gate spacers 138. In some embodiments, the first part 182a has a generally uniform cross-section along the longitudinal direction of the gate electrode layer 182. The second part 182b is in contact with the HK dielectric layer 180 between the dielectric spacers 144. The second part 182b is shaped in accordance with the profile of the dielectric spacers 144, such as the profile discussed above with respect to FIG. 12E.

Figure 19B:
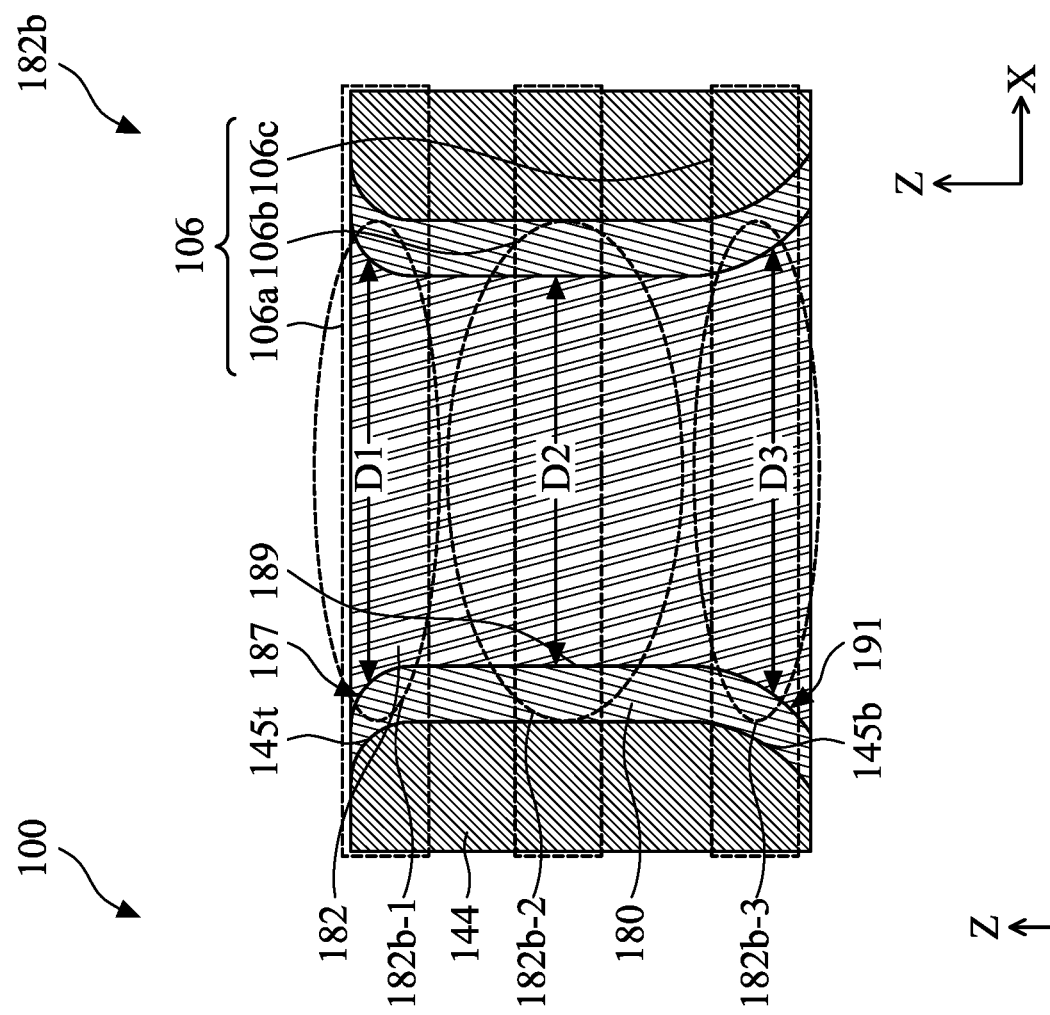
FIG. 19B is an enlarged view of a portion of the semiconductor device structure of FIG. 19A, in accordance with some embodiments.

FIG. 19B is an enlarged view of a portion of the semiconductor device structure 100 of FIG. 19A, showing positional relationship between the second part 182b of the gate electrode layer 182 and the layers adjacent to the gate electrode layer 182, in accordance with some embodiments. In FIG. 19B, the second part 182b of the gate electrode layer 182 includes an upper portion 182b-1 adjacent one of the first semiconductor layers 106 (e.g., first semiconductor layer 106a represented by dotted lines), a middle portion 182b-2 adjacent one of the first semiconductor layers 106 (e.g., first semiconductor layer 106b represented by dotted lines), and a bottom portion 182b-3 adjacent one of the first semiconductor layers 106 (e.g., first semiconductor layer 106c represented by dotted lines). The upper portion 182b-1 may have a first dimension D1, the middle portion 182b-2 may have a second dimension D2, and the bottom portion 182b-3 may have a third dimension D3. In some embodiments, the first dimension D1 is greater than the second dimension D2, and the third dimension D3 is greater than the first dimension D1. In some embodiments, which can be combined with any other embodiment of the present disclosure, the upper portion 182b-1 has a curved exterior surface having a first radius (Re) of curvature 187, the middle portion 182b-2 has a substantially flat surface 189, and the bottom portion 182b-3 has a curved exterior surface having a second radius (Re) of curvature 191 that is greater than the first radius (Re) of curvature 187. In some embodiments, the first radius (Re) of curvature 187 substantially corresponds to the first radius (Re) of curvature 145t (of the upper section of the second side 143b of the dielectric spacers 144), and the second radius (Re) of curvature 191 substantially corresponds to the second radius (Re) of curvature 145b (of the lower section of the second side 143b of the dielectric spacers 144). In one embodiment, the ratio of the first radius (Re) of curvature 187 to the second radius (Re) of curvature 191 may be in the range of about 0.5 to about 0.9, for example about 0.6 to about 0.8.

Figure 20C:
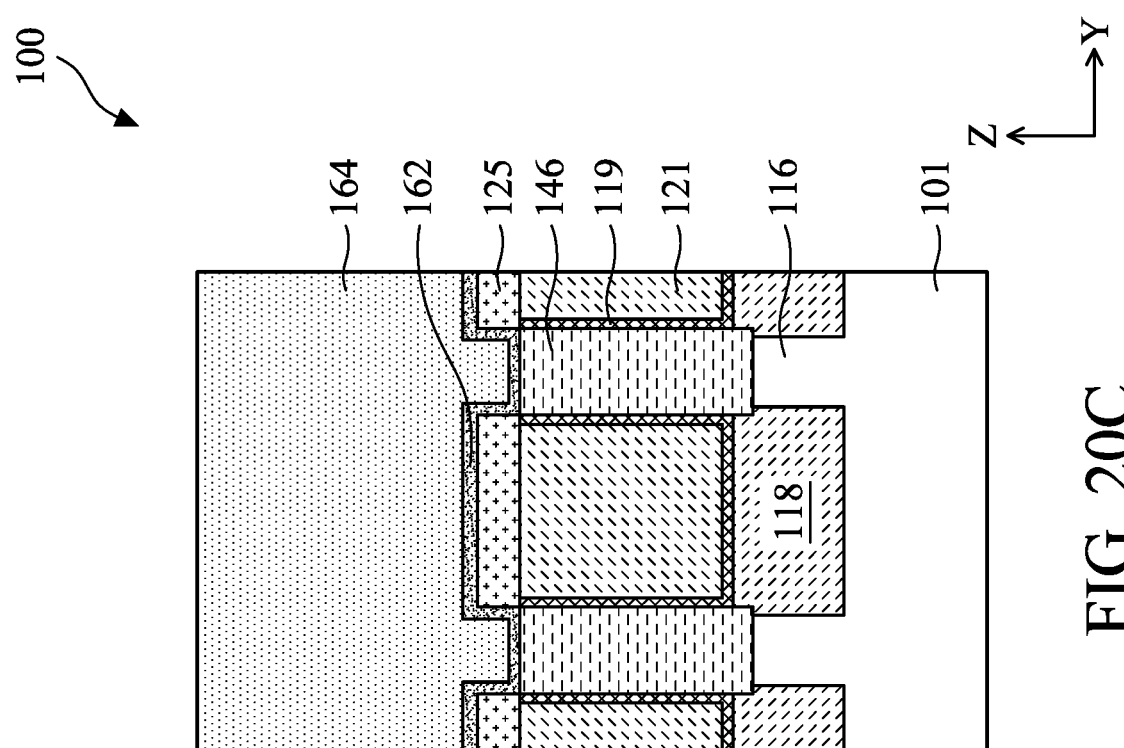

FIGS. 20A-20C to 21A-21C are cross-sectional views of one of the various stages of the semiconductor device structure 100 taken along cross-sections A-A, B-B, and C-C of FIG. 9, in accordance with some embodiments. FIGS. 20A-20C show the semiconductor device structure 100 after formation of the gate electrode layer 182.

Figures 21A, 21B:
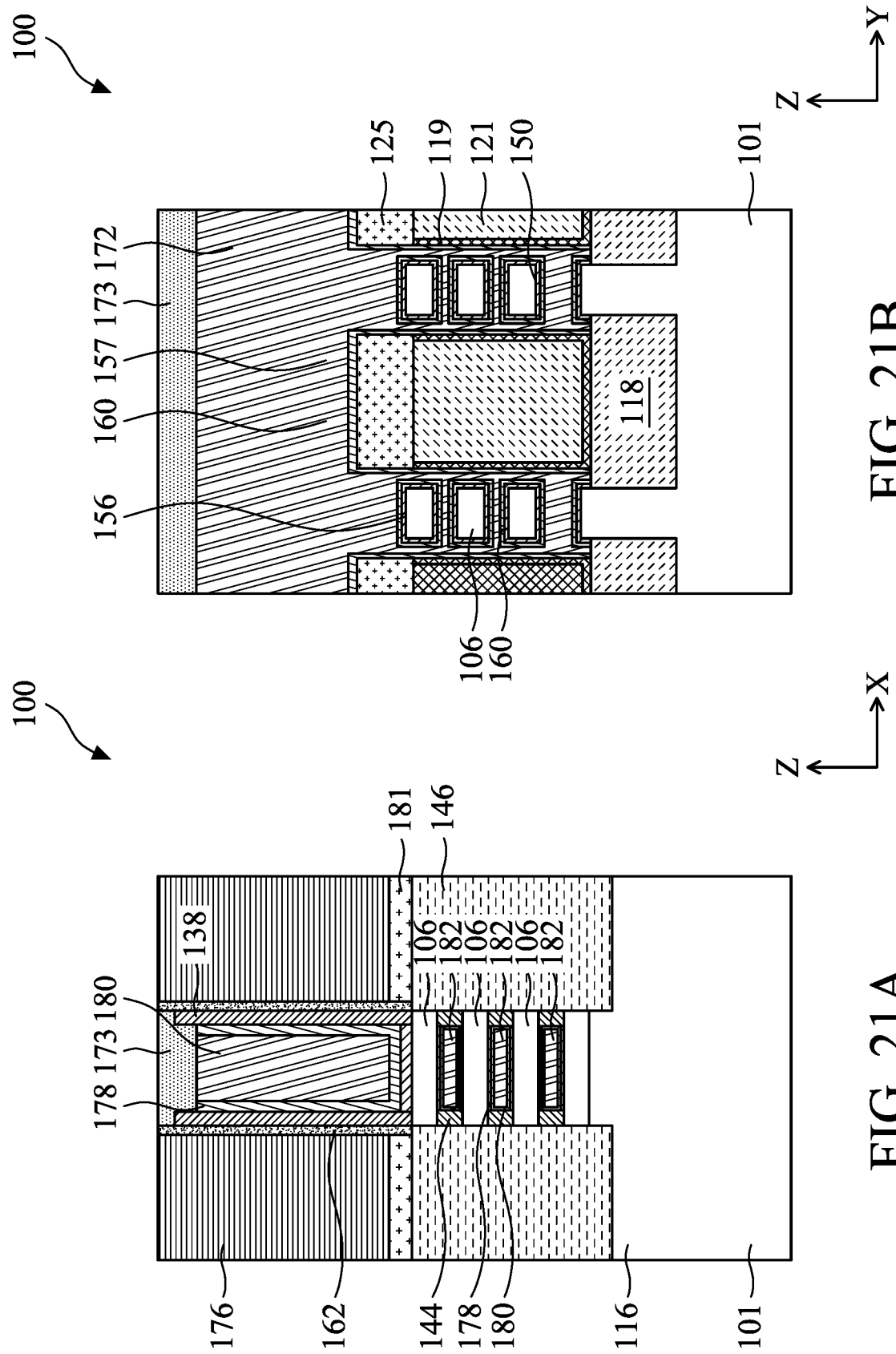
Figure 21C:
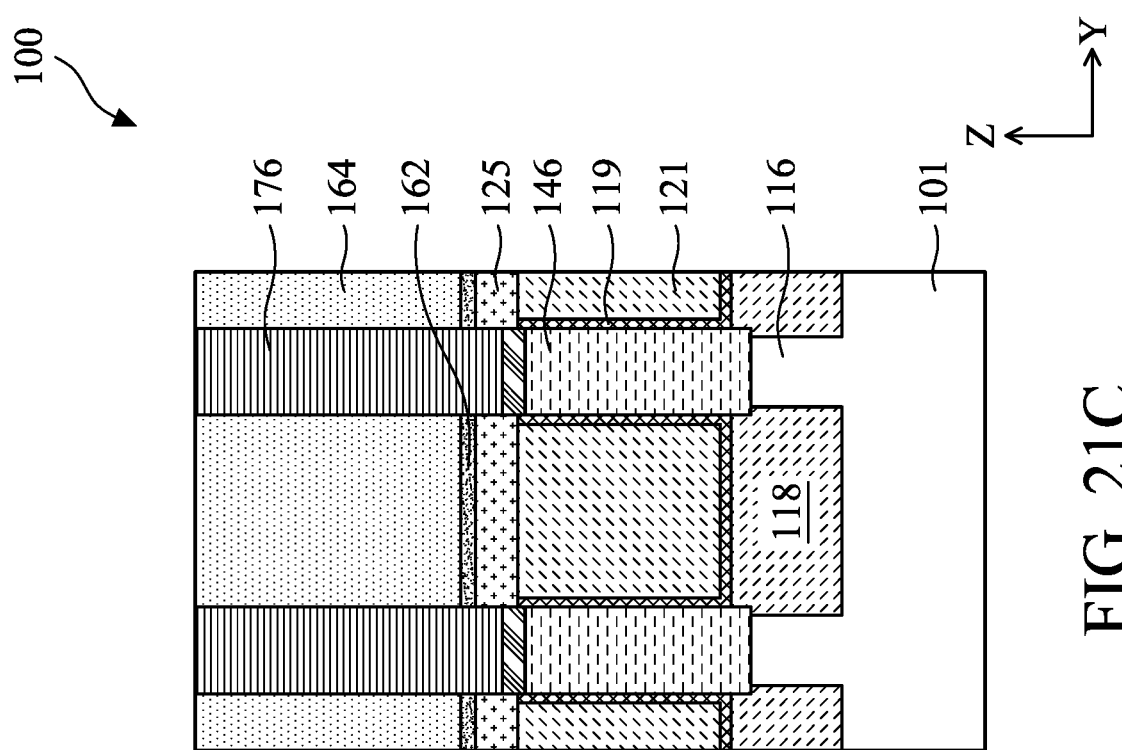

In FIGS. 21A-21C, one or more metal gate etching back (MGEB) processes are performed so that top surfaces of the gate electrode layer 182 and the HK dielectric layer 180 are substantially co-planar. The MGEB processes may be any suitable process, such as a dry etch, a wet etch, or a combination thereof. In some embodiments, portions of the spacers 138 may be etched back so that the top surface of the spacers 138 is higher than the top surfaces of the gate electrode layer 182 and the HK dielectric layer 180. In such cases, trenches formed above the gate electrode layer 182 and the HK dielectric layer 180 as a result of the MGEB processes may be filled with a self-aligned contact (SAC) layer 173. The SAC layer 173 can be formed of any dielectric material that has different etch selectivity than the CESL 162 and serves as an etch stop layer during subsequent trench and via patterning for metal contacts.

After formation of the self-aligned contact layer 173, contact openings are formed through the ILD layer 164 (FIG. 19A) and the CESL 162 to expose the epitaxial S/D feature 146. A silicide layer 181 is then formed on the epitaxial S/D features 146 to conductively couple the epitaxial S/D features 146 to the subsequently formed S/D contacts 176. The silicide layer 181 may be formed by depositing a metal source layer over the epitaxial S/D features 146 and performing a rapid thermal annealing process. The metal source layer includes a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. During the rapid anneal process, the portion of the metal source layer over the epitaxial S/D features 146 reacts with silicon in the epitaxial S/D features 146 to form the silicide layer 181. Unreacted portion of the metal source layer is then removed.

After formation of the silicide layer 181, a conductive material is formed in the contact openings and form the S/D contacts 176. The conductive material may be made of a material including one or more of Ru, Mo, Co, Ni. W, Ti, Ta, Cu, Al, TiN and TaN. While not shown, a barrier layer (e.g., TiN, TaN, or the like) may be formed on sidewalls of the contact openings prior to forming the S/D contacts 176. Once the S/D contracts 176 are formed, a planarization process, such as CMP, is performed to expose the top surface of the SAC layer 173 (or top surface of the gate electrode layer 182 if the SAC layer 173 was not used).

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 by flipping over the semiconductor device structure 100, removing the substrate 101, and selectively connecting source or drain feature/terminal of the epitaxial S/D features 146 to a backside power rail (e.g., positive voltage VDD or negative voltage VSS) through the backside contacts. Depending on the application, the source or drain feature/terminal of the epitaxial S/D features 146 and the gate electrode layer 182 may be connected to a frontside power source.

Various embodiments or examples described herein offer multiple advantages over the state-of-art technology. According to embodiments of the present disclosure, methods for preventing germanium loss from cladding layer during fabrication of semiconductor device structures are provided. Germanium loss from cladding layer may lead to underetching of the cladding layer during formation of nanosheet channels in gate all around (GAA) transistors, such as nanosheet FETs. In some embodiments, the method includes forming fin structures each having first semiconductor layer (e.g., Si) and second semiconductor layer (e.g., SiGe) alternatingly arranged, forming a germanium-containing cladding layer on the fin structures, and forming a conformal nitrogen-containing layer on the cladding layer. The nitrogen-containing layer may function as an oxidizing blocking layer that reduce the oxidation of the cladding layer. The method further includes forming a high-k dielectric layer on a hybrid fin structure disposed between the fin structures, annealing the high-k dielectric layer at a reduced temperature range between about 600° C. and about 850° C., which helps with germanium preservation in the cladding layer, thereby improving smiling profile at top portion of the cladding layer during the subsequent removal process. As thermal budge reduction and oxidizing blocking layer together prevent germanium loss in the cladding layer, underetching of the cladding layer during recessing of the second semiconductor layers and formation of the nanosheet channels can be avoided.

An embodiment is a semiconductor device structure. The structure includes a plurality of semiconductor layers and a gate electrode layer surrounding each semiconductor layer of the plurality of semiconductor layers. The gate electrode layer comprises a first part and a second part below the first part. The second part comprises a first portion disposed adjacent a first semiconductor layer of the plurality of semiconductor layers, and an exterior surface of the first portion having a first radius of curvature, a second portion below the first portion and adjacent a second semiconductor layer of the plurality of semiconductor layers, and a third portion below the second portion and adjacent a third semiconductor layer of the plurality of semiconductor layers, and an exterior surface of the third portion having a second radius of curvature greater than the first radius of curvature.

Another embodiment is a semiconductor device structure. The structure includes a stack of semiconductor layers, a gate electrode layer surrounding each semiconductor layer of the stack of semiconductor layers, and a dielectric spacer disposed adjacent the stack of semiconductor layers, the dielectric spacer having a first side and a second side opposing the first side. The second side comprises a first section in contact with a first semiconductor layer of the stack of semiconductor layers, the first section having a first radius of curvature, and a second section disposed below the first section, the second section being in contact with a second semiconductor layer of the stack of semiconductor layers, and the second section having a second radius of curvature greater than the first radius of curvature.

A further embodiment is a method for forming a semiconductor device structure. The method includes forming first and second fin structures each comprising a plurality of first semiconductor layers and a plurality of second semiconductor layers alternatingly stacked, forming a sacrificial layer over a portion of the first and second fin structures, forming a liner layer on the sacrificial layer, forming an oxide layer on the liner layer, removing portions of the liner layer and the oxide layer to form a trench between the first and second fin structures, forming a dielectric material in the trench, forming a sacrificial gate structure over the first and second fin structures, removing portions of the sacrificial layer and edge portions of each of the plurality of second semiconductor layers in the first and second fin structures to form cavities, forming a dielectric spacer in the cavities, wherein the dielectric spacer has a first section having a first radius of curvature and a second section having a second radius of curvature greater than the first radius of curvature. The method also includes forming an epitaxial source/drain feature on opposite sides of the sacrificial gate structure, the epitaxial source/drain feature being in contact with the dielectric spacer and each of the plurality of first semiconductor layers in the first and second fin structures, removing the sacrificial layer and portions of the plurality of second semiconductor layers to expose portions of each of the plurality of first semiconductor layers of the first and second fin structures, and forming a gate electrode layer to surround each of the plurality of first semiconductor layers of the first and second fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
a plurality of semiconductor layers; and
a gate electrode layer surrounding each semiconductor layer of the plurality of semiconductor layers, wherein the gate electrode layer comprises:
 a first part; and
 a second part below the first part, the second part comprising:
  a first portion, wherein an exterior surface of the first portion has a first radius of curvature;
  a second portion below the first portion; and
  a third portion below the second portion, wherein an exterior surface of the third portion having a second radius of curvature different than the first radius of curvature,
   wherein the first portion, the second portion, and the third portion are connected and formed as an integral.

2. The semiconductor device structure of claim 1, wherein the second radius of curvature is greater than the first radius of curvature.

3. The semiconductor device structure of claim 2, wherein the second portion has a substantially flat surface.

4. The semiconductor device structure, of claim 1, wherein the second part extends across the plurality of semiconductor layers.

5. The semiconductor device structure of claim 4, wherein the first portion is disposed adjacent a first semiconductor layer of the plurality of semiconductor layers, the second portion is disposed adjacent a second semiconductor layer of the plurality of semiconductor layers, and the third portion is disposed adjacent a third semiconductor layer of the plurality of semiconductor layers.

6. The semiconductor device structure of claim 5, further comprising:
a high-k (HK) dielectric layer in contact with the gate electrode layer and surrounding each semiconductor layer of the plurality of semiconductor layers; and
dielectric spacers in contact with the HK dielectric layer, wherein the first part of the gate electrode layer is disposed between gate spacers and the second part of the gate electrode layer is disposed between the dielectric spacers.

7. The semiconductor device structure of claim 6, further comprising:
a source/drain feature in contact with the dielectric spacers and the first, second, and third semiconductor layers of the plurality of semiconductor layers.

8. The semiconductor device structure of claim 3, wherein the first portion has a first dimension and the third portion has a second dimension greater than the first dimension.

9. A semiconductor device structure, comprising:
a plurality of semiconductor layers vertically stacked;
a gate electrode layer surrounding each semiconductor layer of the plurality of semiconductor layers;
a high-k (HK) dielectric layer in contact with the gate electrode layer;
a source/drain feature in contact with each semiconductor layer of the plurality of semiconductor layers; and
a dielectric spacer disposed between the HK dielectric layer and the source/drain feature, wherein the dielectric spacer has a first side in contact with the source/drain feature and a second side in contact with the HK dielectric layer, and the second side comprising:
 a first section has a first curved surface having a first radius of curvature; and
 a second section has a second curved surface having a second radius of curvature different than the first radius of curvature,
  wherein the first section and the second section are connected and formed as an integral.

10. The semiconductor device structure of claim 9, wherein the second radius of curvature is greater than the first radius of curvature.

11. The semiconductor device structure of claim 9, wherein the first section is in contact with a first semiconductor layer of the plurality of semiconductor layers and the second section is in contact with a second, semiconductor layer of the plurality of semiconductor layers, wherein the second semiconductor layer is disposed below the first semiconductor layer.

12. The semiconductor device structure of claim 11, wherein the second side further comprises:
a third section disposed between the first section and the second section, wherein the third section has a substantial flat surface.

13. The semiconductor device structure of claim 12, wherein the third section is in contact with a third semiconductor layer of the plurality of semiconductor layers.

14. The semiconductor device structure of claim 9, wherein the gate electrode layer further comprises a first part disposed between two adjacent gate spacers and a second part disposed between two adjacent dielectric spacers.

15. The semiconductor device structure of claim 14, wherein the second part comprises:
a first portion having a first dimension;
a second portion having a second dimension greater than the first dimension; and
a third portion disposed between the first and second portions, wherein the third portion has a third dimension less than the first dimension.

16. The semiconductor device structure of claim 15, wherein the second portion has a substantial flat surface.

17. A method for forming a semiconductor device structure, comprising:
forming first and second fin structures each comprising a plurality of first semiconductor layers and a plurality of second semiconductor layers alternatingly stacked;
forming a sacrificial layer on exposed sidewall surfaces of the first and second fin structures;
forming a sacrificial gate structure over a portion of the first and second fin structures and the sacrificial layer;
removing portions of the first and second fin structures and the sacrificial layer not covered by the sacrificial gate structure;
removing edge portions of the sacrificial layer and edge portions of each of the plurality of second semiconductor layers in the first and second fin structures to form cavities, wherein edge portions of the sacrificial layer are etched at a first amount and edge portions of each of the plurality of second semiconductor layers are etched at a second amount less than the first amount;
forming a dielectric spacer in the cavities;
forming an epitaxial source/drain feature on opposite sides of the sacrificial gate structure, the source/drain feature being in contact with the dielectric spacer and each of the plurality of first semiconductor layers in the first and second fin structures;

removing the sacrificial layer and the second semiconductor layers to expose portions of each of the plurality of first semiconductor layers of the first and second fin structures; and forming a gate electrode layer to surround each of the plurality of first semiconductor layers of the first and second fin structures.

18. The method of claim 17, wherein the dielectric spacer has a first section having a first radius of curvature and a second section having a second radius of curvature different than the first radius of curvature.

19. The method of claim 17, further comprising:

after forming a sacrificial layer on exposed sidewall surfaces of the first and second fin structures, forming an oxidizing blocking layer on the sacrificial layer;

forming a dielectric material on the oxidizing blocking layer and trenches between the first and second fin structures.

20. The method of claim 19, wherein the sacrificial layer is a germanium-containing layer in amorphous state.

* * * * *